(12) United States Patent
Ishibashi

(10) Patent No.: US 7,924,201 B2
(45) Date of Patent: Apr. 12, 2011

(54) CURRENT OUTPUT TYPE DIGITAL-ANALOG CONVERSION CIRCUIT, AND GRAPHIC DISPLAY DEVICE

(75) Inventor: Osamu Ishibashi, Tokyo (JP)

(73) Assignee: NEC Corporation, Tokyo (JP)

( * ) Notice: Subject to any disclaimer, the term of this patent is extended or adjusted under 35 U.S.C. 154(b) by 103 days.

(21) Appl. No.: 12/513,732

(22) PCT Filed: Nov. 5, 2007

(86) PCT No.: PCT/JP2007/071855
§ 371 (c)(1),
(2), (4) Date: May 6, 2009

(87) PCT Pub. No.: WO2008/056798
PCT Pub. Date: May 15, 2008

(65) Prior Publication Data
US 2010/0045502 A1    Feb. 25, 2010

(30) Foreign Application Priority Data
Nov. 7, 2006 (JP) .................................. 2006-301191

(51) Int. Cl.
*H03M 1/80* (2006.01)
(52) U.S. Cl. ....................................... 341/153; 341/144

(58) Field of Classification Search .................. 341/153, 341/144, 145, 146, 135, 138, 139; 327/108; 345/690
See application file for complete search history.

(56) References Cited

U.S. PATENT DOCUMENTS
6,236,346 B1 * 5/2001 Schofield et al. ............. 341/144

FOREIGN PATENT DOCUMENTS
| JP | 58-194425 | 11/1983 |
| JP | 04-081129 | 3/1992 |
| JP | 2004-112183 | 4/2004 |

* cited by examiner

*Primary Examiner* — Joseph Lauture
(74) *Attorney, Agent, or Firm* — Young & Thompson

(57) ABSTRACT

A current output type digital-analog conversion circuit which outputs a current signal includes a decoder for decoding higher-order bits of input digital data, a plurality of binary current generators, and a current adder. Each of the binary current generators includes a device for outputting a binary current which increases linearly as binary values according to lower-order bits of the input digital data, and a device for outputting a predetermined all-ON current. Either the device for outputting the binary current or the element for outputting the all-ON current of the binary current generator is selected according to a decode signal output by the decoder. The current adder adds up and outputs the binary currents and the all-ON currents output by the plurality of binary current generators.

20 Claims, 23 Drawing Sheets

CURRENT OUTPUT TYPE DIGITAL-ANALOG CONVERSION CIRCUIT, AND GRAPHIC DISPLAY DEVICE

TECHNICAL FIELD

The present invention relates to a current output type digital-analog conversion circuit and a graphic display device, and in particular to a current output type digital-analog conversion circuit for converting an input video signal to analog modulation current in order to modulate the light emission intensity of a light emitting element such as a laser diode (semiconductor laser) in accordance with the input video signal, and to a graphic display device such as a projector using a laser diode as light source. The present invention also relates to a current output type digital-analog conversion circuit for supplying a gamma-corrected current signal to a drive circuit and a graphic display device.

BACKGROUND ART

In recent years, practical use has been made about projector type graphic display devices using a light emitting element such as a laser diode (hereafter, referred to in abbreviation as "LD") as a light source. In these projector type graphic display devices, video images are displayed on a screen by scanning and projecting a light beam emitted by the light source (laser beam light) by means of a scanning device such as a mirror. In order to represent gradation with such a graphic display device, the light beam from the light source must be modulated by some sort of means. One of such means is a method in which electric current driving a LD is directly controlled to modulate the light emission intensity of the LD.

On the other hand, when video signals are to be displayed on a display other than a CRT, so-called gamma correction should be performed to match light-emission brightness characteristics of the CRT In general, when the video signal level is represented by VIN, the gamma correction is performed such that the output brightness Lout is proportional to 2.2-th power of VIN. Therefore, in a projector using a LD as well, LD driving current must be supplied so as to be proportional to 2.2-th power of the video signal level VIN.

Generally, a LD emits a laser light beam when current higher than a certain value (threshold current) is caused to flow. However, it is known that, in LDS, the light output characteristics, in particular the threshold current with respect to drive current varies in accordance with changes in temperature or changes with time. Therefore, even if a LD is driven with constant current, the light emission intensity will vary along with variation of the threshold current.

For this reason, automatic power control (APC) is employed to control the amount of drive current by detecting the light emission intensity. In general, when the APC is employed in a graphic display device or an image write device, the APC is operated to adjust the amount of light during a non-display period (blanking period) contained in a video signal. During a video display period, an APC voltage detected during the blanking period is held by a hold circuit and control is performed so that a constant current is output from the LD drive circuit.

Referring to FIG. 16, description will be made of a conventional current output type digital-analog conversion circuit capable of performing gamma correction. The illustrated gamma-corrected current output digital-analog conversion circuit is composed of a look-up table 101, a bit conversion circuit 102, a binary current generator 103, and a reference current circuit 104.

The look-up table 101 describes an m-bit data pattern corresponding to an n-bit data pattern, satisfying the relationship of m>n. The bit conversion circuit 102 refers to the look-up table 101 and converts the n-bit input digital data D0 to D(n−1) into m-bit data D0 to D(m−1). The binary current generator 103 outputs a current IDAC which increases in a binary manner according to the input digital data. The reference current circuit 104 supplies the binary current generator 103 with a reference current IREF which serves as a reference for an output current IDAC of the binary current generator 103 and is adjustable by a control signal CNT.

The circuit shown in FIG. 16 performs gamma correction in the following procedures. The m-bit output data described in the look-up table 101 assume values proportional to 2.2-th powers of the n-bit input data. Accordingly, the n-bit input digital data D0 to D(n−1) is converted into gamma-corrected m-bit data D0 to D(m−1) by the bit conversion circuit 102, and thus a gamma-corrected output current IDAC can be output from the binary current generator 103.

FIG. 17 shows a LD drive circuit using this gamma-corrected current output digital-analog conversion circuit. This LD current drive circuit is composed of a gamma-corrected current output digital-analog circuit 112, a bias current output circuit 119, an adder 120, a drive current output unit 113, a LD 114, a light intensity detector 115, a comparator 117, and a sample hold circuit (S/H) 118.

The gamma-corrected current output digital-analog circuit 112 outputs a gamma-corrected output current IDAC. The bias current output circuit 119 outputs a bias current IBIAS which is adjustable by a control signal CNT0. The adder 120 adds up the current IDAC and the bias current IBIAS. The drive current output unit 113 outputs a drive current IOUT. The LD 114 outputs laser light according to the drive current IOUT. The light intensity detector 115 detects the intensity of light output by the LD 114 and outputs a detection voltage DET The comparator 117 compares the detection voltage DET with a reference voltage VREF and outputs a difference voltage. The sample hold circuit 118 sample-holds the output voltage of the comparator 117.

The LD current drive circuit shown in FIG. 17 performs APC in the following procedures. In the first place, predetermined input data is input to the gamma-corrected current output DAC circuit 112, and the LD 114 is driven at a certain current value. The light intensity detector 115 detects the intensity of the light thus output by the LD 114 and outputs a detection voltage DET of a certain value. The comparator 117 compares the detection voltage value DET with the reference voltage VREF1 or VREF2, and outputs a difference voltage.

This difference voltage is fed back, via the sample hold circuit 118, as a control signal CNT0 for adjusting the output current IBIAS of the bias current output circuit 119 and as a control signal CNT1 for adjusting the output current IDAC of the gamma-corrected current output DAC 112. Eventually, the detection voltage DET output by the light intensity detector 115 becomes equal to the reference voltage VREF1 or VREF2, and the LD 114 emits light at a desired intensity in accordance with the predetermined input data. This makes it possible to prevent the LD from varying its output light intensity due to variation of the threshold current.

In contrast, in the LD drive circuit using a gamma-corrected current output digital-analog conversion circuit, shown in FIG. 16, only two current values, namely a bias current IBIAS and a reference current IREF are set by the APC control. This means that the APC control is not conducted on any current corresponding to intermediate gradation, which makes it difficult to perform precise gamma correction. In addition, a look-up table and a bit conversion circuit are required to perform gamma correction.

A gamma-corrected current output digital-analog conversion circuit to solve this problem is proposed in Patent Document 1 (Japanese Laid-Open Patent Publication NO. 2004-112183, page 20, FIG. 4). The current output type digital-analog conversion circuit proposed in FIG. 4 of Patent Document 1 is shown in FIG. 18 attached herein. This current output type digital-analog conversion circuit is composed of a decoder 81 and a conversion unit 82. The conversion unit 82 has a plurality of current adding type DACs 82-1, 82-2, ... 82-k (k in number in the example shown in FIG. 18).

Each signal group output by the decoder 81 shown in FIG. 18 contains data of $2^{mi}-1$ fixed increments corresponding to higher-order mi bits, data of ni binary increments corresponding to lower-order ni bits, and data of a carrier bit. For example, in the data input to a current adding type DACi, the data DBi0 to DBi(ni−1) are data corresponding to the lower-order ni binary increments, the data DAi1 to DAi($2^{mi}-1$) are data corresponding to the higher-order ($2^{mi}-1$) fixed increments, and the data CRYi is carrier data.

The data DBi0 to DBi(ni−1) corresponding to the lower-order ni binary increments is capable of outputting a current of up to ($2^{ni}-1$) times as high as one LSB, the minimum unit of output current. The data DAi1 to DAi ($2^{mi}-1$) corresponding to the higher-order ($2^{mi}-1$) fixed increments is capable of varying the output current by one unit at a time, the unit being defined by the current corresponding to $2^{ni}$ LSB. The carrier bit CRYi is capable of controlling the current output corresponding to one LSB. It should be noted that, herein, i=1, 2, ..., k.

The current output of the current adding type DAC1 to DACk shown in FIG. 18 will be described, using a specific data example. It is assumed here that 8-bit data DIN, for example, is input to the decoder 81 as image data. The conversion unit 82 converts the 8-bit image data DIN into a current IOUT by means of three current adding type DACs, DAC1, DAC2 and DAC3. This means that k=3 in the conversion unit 82 shown in FIG. 18. It is also assumed that the DAC1 and the DAC2 are 6-bit DACs, while the DAC3 is a 7-bit DAC. Adding these three DACs, $2^6+2^6+2^7=2^8$ is obtained, and hence an 8-bit DAC is obtained. It is assumed that bits of the image data DIN input to the decoder 81 consist of DI7 (MSB) to DI0 (LSB).

FIGS. 19, 20 and 21 show codes output by the decoder 81 when the 8-bit data DI7 to DI0 is input as described in the above. In this case, the DAC1 receives input of lower-order 4-bit data DB10 to DB13, decode signals DA11 to DA13 for the higher-order two bits in the six bits, and the carrier CRY1. The DAC2 receives input of lower-order 4-bit data DB20 to DB23, decode signals DA21 to DA23 for the higher-order two bits in the six bits, and the carrier CRY2. The DAC3 receives input of lower-order 4-bit data DB30 to DB33, decode signals DA31 to DA37 for the higher-order three bits in the seven bits, and the carrier CRY3.

Hereafter, description will be made of respective output currents from the DAC1 to DAC3 in sequence. The 8-bit input data DI7 to DI0 assume an arbitrary value within the range of 0 to 255. The decoder 81 controls the signal group output to the DAC1 to DAC3 in accordance with the values of the input data DI7 to DI0. The DAC1 to DAC3 perform different operations from each other in accordance with the values of the input data DI7 to DI0.

First, description will be made of operations of the DAC1 to DAC3 in accordance with the values of DI7 and DI6. When the input data DI7 to DI0 are from 0 to 63, that is, when DI7=L and DI6=L, the DAC1 performs DAC intrinsic operation. When the input data are from 64 to 255, that is, when the conditions of DI7=L and DI6=L are not satisfied, output currents of the DAC1 corresponding to 64 LSB are all turned ON. This means that, in this case, the DAC1 outputs a current IO1 corresponding to 64 LSB.

As for the DAC2, when the input data DI7 to DI0 are from 0 to 63, that is, when I7=L and DI6=L, output currents of the DAC2 corresponding to 64 LSB are all turned OFF. This means that, in this case, the output current IO2 from the DAC2 is zero. When the input data are from 64 to 127, that is, when DI7=L and DI6=H, the DAC2 performs DAC intrinsic operation. Further, when the input data are from 128 to 255, that is, when DI7=H, output current of the DAC2 corresponding to 64 LSB are all turned ON. This means that, in this case, the DAC2 outputs a current IO2 corresponding to 64 LSB.

As for the DAC3, when the input data are from 0 to 127, that is, when DI7=L, output currents of the DAC3 corresponding to 127 LSB are all turned OFF, This means that, in this case, the output current IO3 from the DAC3 is zero. When the input data are from 128 to 255, that is, when DI7=H, the DAC3 performs DAC intrinsic operation.

In the current output type digital-analog conversion circuit described in FIG. 4 of Patent Document 1, as described above, the gamma curve is divided into a plurality of regions, and the current adding type DACs 82-1 to 82-k are arranged in the plurality of regions, respectively. The current adding type DACs are controlled to assume the non-output state, the normal output state, and the full-output state. The respective current adding type DACs generate reference currents IREF1 to IREFk corresponding to one LSB or a predetermined multiple thereof by using the reference current source, and output a current including the carry in accordance with the input data from the decoder 81.

The current adding type DACs add up and output currents according to the codes corresponding to the fixed increments of the higher-order mi (i=1 to k) bits and the binary increments of the lower-order ni bits generated in accordance with the input data DIN. Further, the currents generated by the current adding type DACs in the respective regions are added up to obtain the total output current IOUT. This configuration makes it possible to supply a drive current which is gamma-corrected without the look-up table or the bit conversion circuit.

FIG. 23 shows a LD drive circuit employing the current output type digital-analog conversion circuit described in FIG. 4 of Patent Document 1. The LD drive circuit shown in FIG. 23 performs APC control on the reference currents IREF1 to IREFk of the reference current source 130. Since the APC control thus can be performed also on the currents corresponding to intermediate gradation, precise gamma correction can be performed.

DISCLOSURE OF THE INVENTION

Problems To Be Solved by the Invention

Nevertheless, the current output type digital-analog conversion circuit disclosed in Patent Document 1 has several problems as follows.

The first problem is that the circuit scale is large. This problem is attributable to the fact that the decoder is required to generate data of ($2^{mi}-1$) fixed increments corresponding to the higher-order mi bits, data of ni binary increments corresponding to the lower-order ni bits, and data of the carrier bit, for all the current adding type DACs, which increases the scale of the decoder circuit.

The second problem is that a large number of control lines are required. This problem is attributable to the fact that the decoder is required to output data of ni binary increments of different data patterns corresponding to the lower-order ni bits for all the k current adding type DACs, and thus k×ni control lines are required.

The present invention seeks to provide a current output type digital-analog conversion circuit which is capable of supplying a gamma-corrected current signal to a LD current drive circuit while reducing the circuit scale and reducing the chip area.

The present invention further seeks to provide a current output type digital-analog conversion circuit capable of reducing the number of control lines.

Means for Solving the Problems

The present invention provides a current output type digital-analog conversion circuit composed of a decoder and a plurality of binary current generators. The current output type digital-analog conversion circuit is characterized in that, the decoder outputs a plurality of decode signals obtained by decoding higher-order bits of input digital data, the binary current generators each have means for outputting a binary current increasing linearly as binary values according to lower-order bits of the input digital data, and means for outputting a predetermined all-ON current; and the current output type digital-analog conversion circuit further includes means for selecting either the means for outputting a binary current or the means for outputting an all-ON current of the binary current generators according to the decode signals output by the decoder, and adding up and outputting the binary currents and the all-ON currents output by the plurality of binary current generators.

Effects of the Invention

The present invention provides a gamma-corrected current output type digital-analog conversion circuit which makes it possible to reduce the circuit scale and to reduce the chip area. This is because the need of a decoder for lower-order bits is eliminated by providing the binary current generators additionally with means for outputting currents from all the binary current sources according to a selection signal obtained by decoding higher-order bits, and means for turning ON/OFF the binary current output according to the selection signal obtained by decoding the higher-order bits.

Further, the present invention provides a current output type digital-analog conversion circuit which is capable of reducing the number of control lines. This is because the lower-order bit data can be supplied in common to all the binary current generators.

BEST MODE FOR CARRYING OUT THE INVENTION

Figure 1:
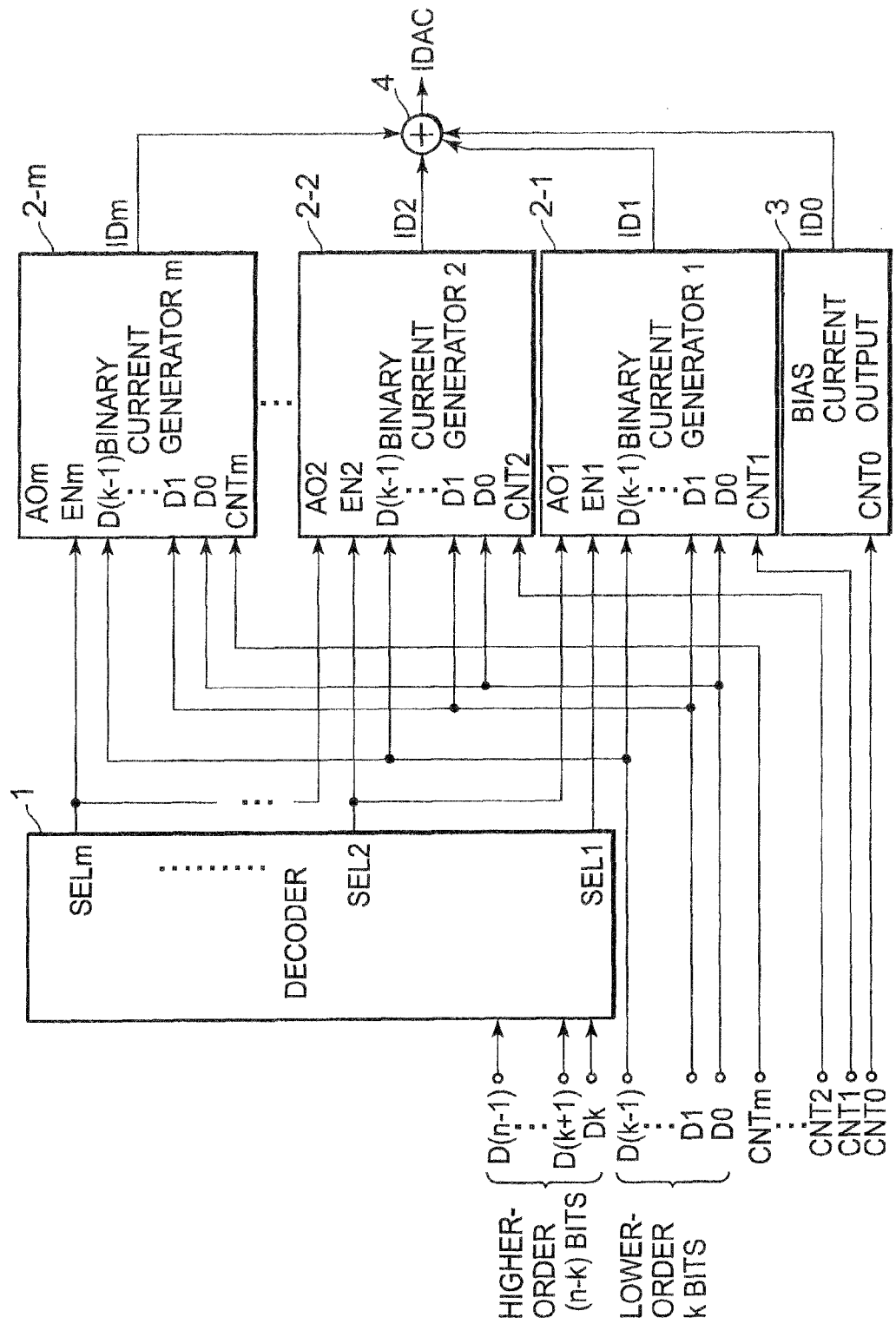
FIG. 1 is a block diagram showing a current output type digital-analog conversion circuit according to an embodiment of the present invention.
Figure 2:
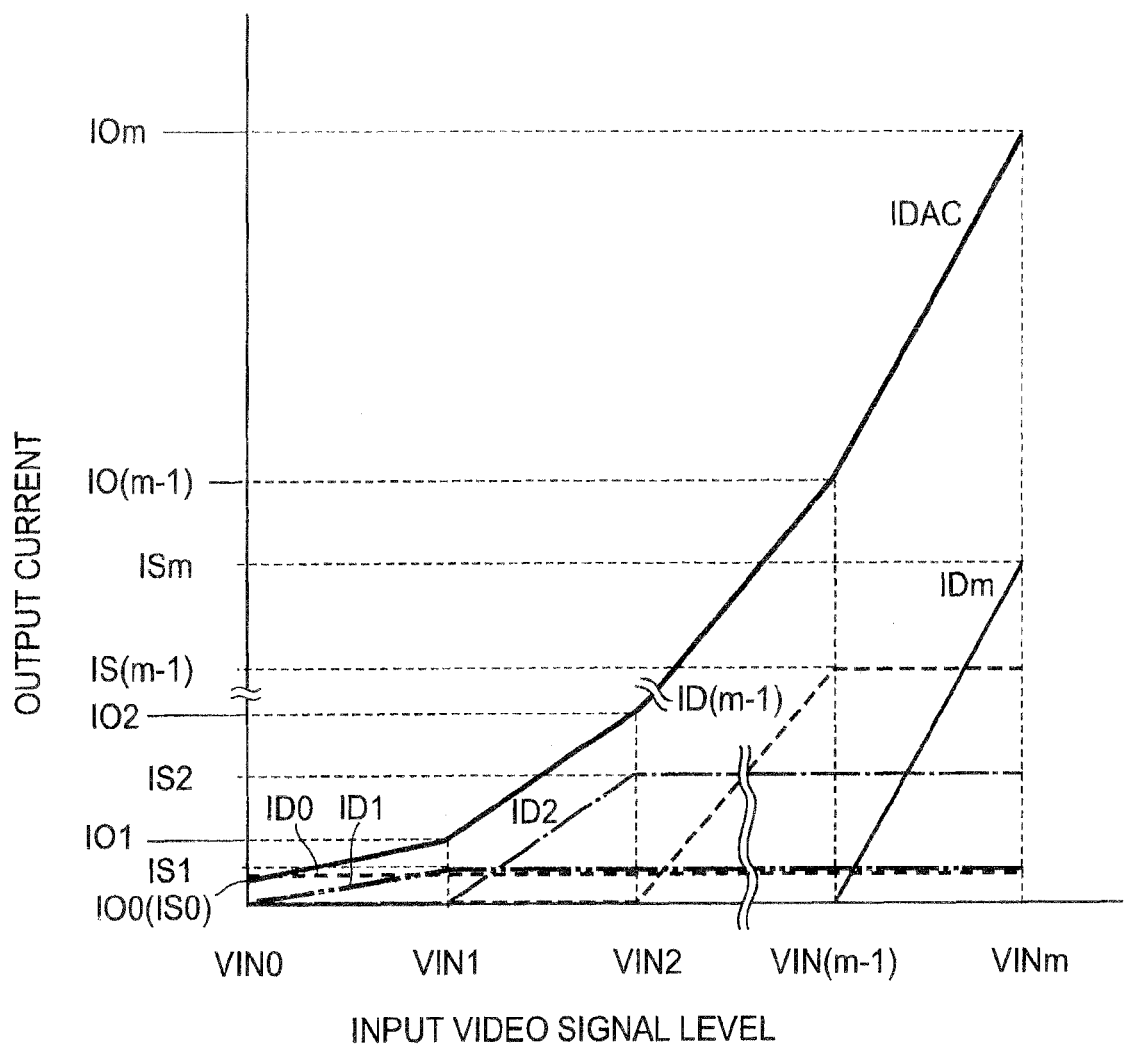
FIG. 2 is a graph showing output current characteristics relative to input video signal levels of the current output type digital-analog conversion circuit according to the embodiment of the present invention.

An embodiment of the present invention will be described in detail with reference to the drawings. FIG. 1 is a block diagram showing an overall configuration of a current output type digital-analog conversion circuit according to an embodiment of the present invention. FIG. 2 shows output current characteristics relative to input video signal levels of the current output type digital-analog conversion circuit.

In the current output type digital-analog conversion circuit of FIG. 1, the numeral 1 denotes a decoder, the numerals 2-1 to 2-m denote binary current generators, 3 denotes a bias current output circuit, and 4 denotes a current adder. Operation of the current output type digital-analog conversion circuit will be described, with reference to input/output characteristics thereof of FIG. 2. The input video signal level VIN is input as input digital data D represented by a digital bit. When the input video signal level is represented by a digital bit, the relationship as shown in Table 1 below is established between the input video signal levels and the input digital data/decoder outputs.

In FIG. 2, an output current IDAC is a current output from the current output type digital-analog conversion circuit, and the output current IDAC has arbitrary non-linear characteristics in relation to the input video signal levels VIN.

The reference numeral ID0 denotes an output current from the bias current output circuit 3 of FIG. 1, ID1 denotes an output current from the binary current generator 2-1 of FIG. 1, ID2 denotes an output current from the binary current generator 2-2 of FIG. 1 . . . , and IDm denotes an output current from the binary current generator 2-m of FIG. 1. Here, the output current IDAC of the current output type digital-analog conversion circuit is a value obtained by adding the output current ID0 from the bias current output circuit 3 and the output currents ID1 to IDm from the binary current generators 2-1 to 2-m.

In FIG. 2, IO0 denotes a current value of the output current IDAC at a video signal level VIN0, IO1 denotes a current value of the output current IDAC at a video signal level VIN0, IO2 denotes a current value of the output current IDAC at a video signal level VIN2, . . . , IO(m−1) denotes a current value of the output current IDAC at a video signal level VIN(m−1), and IOm denotes a current value of the output current IDAC at a video signal level VINm. Further, IS0 denotes a current value of the output current ID0, IS1 denotes a maximum current value of the output current ID1 at the video signal level VIN1, IS2 denotes a maximum current value of the output current ID2 at the video signal level VIN2, . . . , IS(m−1) denotes a maximum current value of the output current ID(m−1) at the video signal level VIN(m−1), and ISm denotes a maximum current value of the output current IDm at the video signal level VINm.

Each block operates as described below. The decoder 1 decodes higher-order (n-k) bits of input digital data and outputs selection signals SEL1 to SELm. Table 1 above shows the relationship between the higher-order (n-k) bits of the input digital data and the selection signals SEL1 to SELm. For example, when the higher-order (n-k) bits of the input digital data are zero in decimal notation (at the input video signal level VIN0), the decoder 1 outputs an ON signal as the selection signal SEL1, and OFF signals as the selection signals SEL2 to SELm.

TABLE 1

| Input signal level | VIN0 | ... | VIN1 | ... | VIN2 | ... | VIN3 | ... | VIN(m − 2) | ... | VIN(m − 1) | ... | VINm |
|---|---|---|---|---|---|---|---|---|---|---|---|---|---|
| Higher-order (n − k) bits | | | | | | | | | | | | | |
| D(n − 1) | 0 | ... | 0 | ... | 0 | ... | 0 | ... | 1 | ... | 1 | ... | 1 |
| D(n − 2) | 0 | ... | 0 | ... | 0 | ... | 0 | ... | 1 | ... | 1 | ... | 1 |
| ... | | | | | | | ... | | | | | | |
| D(k + 1) | 0 | ... | 0 | ... | 1 | ... | 1 | ... | 1 | ... | 1 | ... | 1 |
| Dk | 0 | ... | 1 | ... | 0 | ... | 1 | ... | 0 | ... | 1 | ... | 1 |
| ... | | | | | | | ... | | | | | | |
| Lower-order k bits | | | | | | | | | | | | | |
| D(k − 1) | 0 | ... | 0 | ... | 0 | ... | 0 | ... | 0 | ... | 0 | ... | 1 |
| D(k − 2) | 0 | ... | 0 | ... | 0 | ... | 0 | ... | 0 | ... | 0 | ... | 1 |
| ... | | | | | | | ... | | | | | | |
| D1 | 0 | ... | 0 | ... | 0 | ... | 0 | ... | 0 | ... | 0 | ... | 1 |
| D0 | 0 | ... | 0 | ... | 0 | ... | 0 | ... | 0 | ... | 0 | ... | 1 |
| SELm | OFF | ... | OFF | ... | OFF | ... | OFF | ... | OFF | ... | ON | ... | ON |
| SEL(m − 1) | OFF | ... | OFF | ... | OFF | ... | OFF | ... | ON | ... | ON | ... | ON |
| ... | | | | | | | ... | | | | | | |
| SEL4 | OFF | ... | OFF | ... | OFF | ... | ON | ... | ON | ... | ON | ... | ON |
| SEL3 | OFF | ... | OFF | ... | ON | ... | ON | ... | ON | ... | ON | ... | ON |
| SEL2 | OFF | ... | ON | ... | ON | ... | ON | ... | ON | ... | ON | ... | ON |
| SEL1 | ON | ... | ON | ... | ON | ... | ON | ... | ON | ... | ON | ... | ON |

When an enable signal input ENi is ON, the binary current generator 2-i outputs a current IDi which increases linearly as binary values in accordance with the lower-order k bits of the input digital data. When the enable signal input ENi is OFF, the output current IDi becomes zero. When an all-ON signal input AOi is ON, the binary current generator 2-i outputs a current value ISi obtained by adding up a current output when the lower-order k bits of the input digital data are $2^k$ in decimal notation and a current corresponding to the LSB. Further, the output current IDi is adjustable by a control signal CNTi.

The bias current output circuit 3 constantly outputs the output current ID0 which is adjustable by a control signal CNT0, and the output current value thereof is IS0. The current adder 4 adds up the output current ID0 from the bias current output circuit 3 and the output currents ID1 to IDm from the binary current generators 2-1 to 2-m, and outputs the current IDAC.

The operation becomes as follows when the input video signal level is VIN0, that is, when the input digital data is zero in decimal notation. Since the higher-order (n-k) bits of the input digital data are zero in decimal notation, the decoder 1 outputs an ON signal as the selection signal SEL1, and OFF signals as the selections signals SEL2 to SELm. Thus, the enable signal input EN1 of the binary current generator 2-1 is turned ON, and the binary current generator 2-1 outputs a binary current according to the lower-order k bits. However, since the lower-order k bits are zero in decimal notation, the output current ID1 from the binary current generator 2-1 is zero. The enable signals EN2 to ENm input to the binary current generators 2-2 to 2-m are turned OFF, and hence the binary current generators do not operate. Accordingly, the current adder 4 outputs only the output current value IS0 of the bias current output circuit 3, and thus the output current IDAC=IS0.

Next, the operation becomes as follows when the input video signal level is VINi (provided that $0 \leq i < m$), that is, when the higher-order (n-k) bits of the input digital data are i in decimal notation, and the lower-order k bits are zero in decimal notation.

Since the higher-order (n-k) bits of the input digital data are i in decimal notation, the decoder 1 outputs ON signal as the selection signals SEL1 to SEL(i+1), and outputs OFF signals as the selection signals SEL(i+2) to SELm. The enable signals EN1 to ENi and the all-ON signals AO1 to AOi to the binary current generators 2-1 to 2-i are both ON. The enable signal EN(i+1) to the binary current generator 2-(i+1) is ON and the all-ON signal AO(i+1) is OFF. The enable signals EN(i+2) to ENm and all-ON signals AO(i+2) to AOm input to the binary current generators 2-(i+2) to 2-m are both OFF.

As a result, the output currents ID1 to IDi from the binary current generators 2-1 to 2-i become IS1 to ISi. The binary current generator 2-(i+1) outputs a binary current ID(i+1) according to the lower-order k bits, The binary current generators 2-(i+2) to 2-m output no current. However, since the lower-order k bits are zero in decimal notation, the output current ID(i+1) from the binary current generator 2-(i+1) is zero. Therefore, the current adder 4 adds up the output current value IS0 from the bias current output circuit 3 and the output current values IS1 to ISi from the binary current generator 2-1 to 2-i, and thus the output current IDAC=IS0+IS1+ . . . +ISi=IOi.

Next, the operation becomes as follows when the input video signal level is VINi or higher but lower than VIN(i+1) (provided that $0 \leq i < m$), that is, when the higher-order (n-k) bits of the input digital data are i in decimal notation.

Since the higher-order (n-k) bits of the input digital data are i in decimal notation, the decoder 1 outputs ON signals as the selection signals SEL1 to SEL(i+1), and OFF signals as the selections signals SEL(i+2) to SELm. The enable signals EN1 to ENi and all-ON signals AO1 to AOi input to the binary current generators 2-1 to 2-i are both ON. The enable signal EN(i+1) input to the binary current generator 2-(i+1) is ON and the all-ON signal AO(i+1) input thereto is OFF. The enable signals EN(i+2) to ENm and all-ON signals AO(i+2) to AOm input to the binary current generators 2-(i+2) to 2-m are both OFF.

As a result, the output currents ID1 to IDi from the binary current generators 2-1 to 2-i become IS1 to ISi. The binary current generator 2-(i+1) outputs a binary current ID(i+1) according to the lower-order k bits, while the binary current generators 2-(i+2) to 2-m output no current, Therefore, the current adder 4 adds up the output current value IS0 of the bias current output circuit 3, the output current values IS1 to ISi of the binary current generators 2-1 to 2-i, and the output current ID(i+1) of the binary current generator 2-(i+1), and thus the output current IDAC=IS0+IS1+IS0+ISi+ID(i+1).

Next, the operation becomes as follows when the input video signal level is VINm, that is, when the higher-order (n-k) bits of the input digital data are $2^{n-k}$ in decimal notation, and the lower-order k bits are $2^k$ in decimal notation.

Since the higher-order (n-k) bits of the input digital data are $2^{n-k}$ in decimal notation, the decoder 1 outputs ON signals as the selection signals SELL to SELm. The enable signals EN, to EN(m−1) and the all-ON signals AO1 to AO(m−1) input to the binary current generators 2-1 to 2-(m−1) are both ON. The enable signal ENm input to the binary current generator 2-m is ON, while the all-ON signal input AOm is OFF.

Accordingly, the output currents ID1 to ID(m−1) of the binary current generators 2-1 to 2-(m−1) become IS1 to IS(m−1), and since the lower-order k bits are $2^k$ in decimal notation, the output current IDm of the binary current generator 2-m becomes ISm. Therefore, the current adder 4 adds up the output current value IS0 of the bias current output circuit 3 and the output current values IS1 to Ism of the binary current generators 2-1 to 2-m, and thus the output current IDAC=IS0+IS1+ . . . +ISm=IOm.

As a result, the output current IDAC of the current output type digital-analog conversion circuit has characteristics as shown in FIG. 2 in relation to the input video signal levels VIN. The current output type digital-analog conversion circuit is enabled to output a gamma-corrected output current IDAC by setting the output current values IS1 to Ism of the binary current generators 2-1 to 2-m such that the output current values IO0 to IOm corresponding to the video signal levels VIN0 to VINm of the current output type digital-analog conversion circuit are proportional to 2.2-th power of the decimal values of the video signal levels VIN0 to VINm.

As seen from the description above, in the current output type digital-analog conversion circuit of the present invention, the decoder sequentially outputs an ON signal as the selection signal SELL and onwards as the higher-order bit of the input digital signal is incremented. As a result of the selection signal SEL1 being turned ON, the binary current generator 1 outputs an all-ON current. In this manner, as the selection signals SEL1 to SELm are sequentially turned ON, an all-ON current is sequentially output from the binary current generators 1 to m. The current output type digital-analog conversion circuit is thus enabled to output a gamma-corrected output current by appropriately setting the output currents from the binary current generators. Additionally, since only the higher-order bits of an input digital signal are decoded by the decoder, no decoder is required for the lower-order bits, and the lower-order bits of the input digital signal can be directly input to the binary current generators.

Next, an example of a circuit in which the current output type digital-analog conversion circuit according to the embodiment of the present invention is applied to a light emitting element drive circuit and operation thereof will be described with reference to the drawings.

Figure 3:
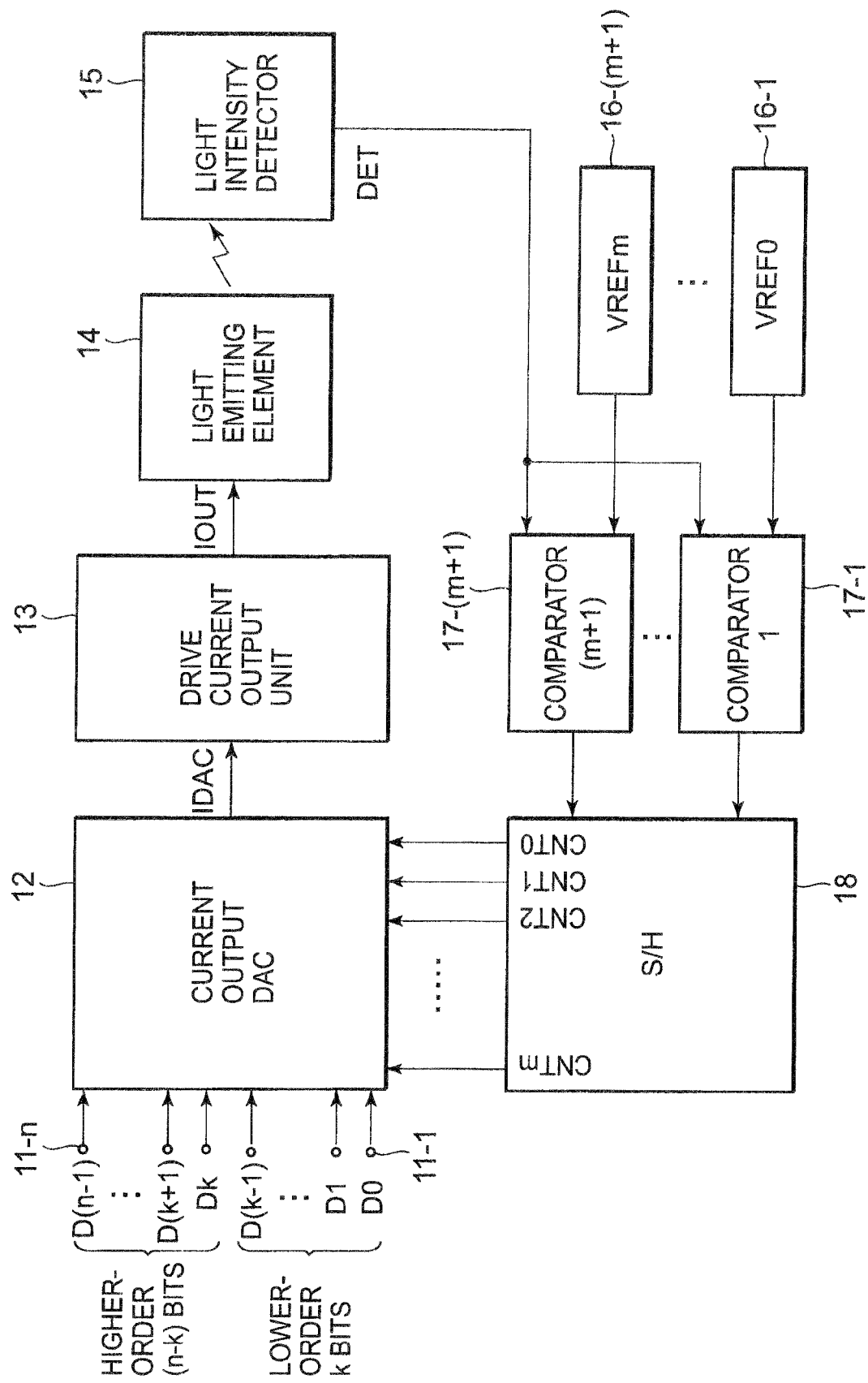
FIG. 3 is a block diagram showing a configuration of a light emitting element drive circuit using the current output type digital-analog conversion circuit according to the embodiment of the present invention.
Figure 4:
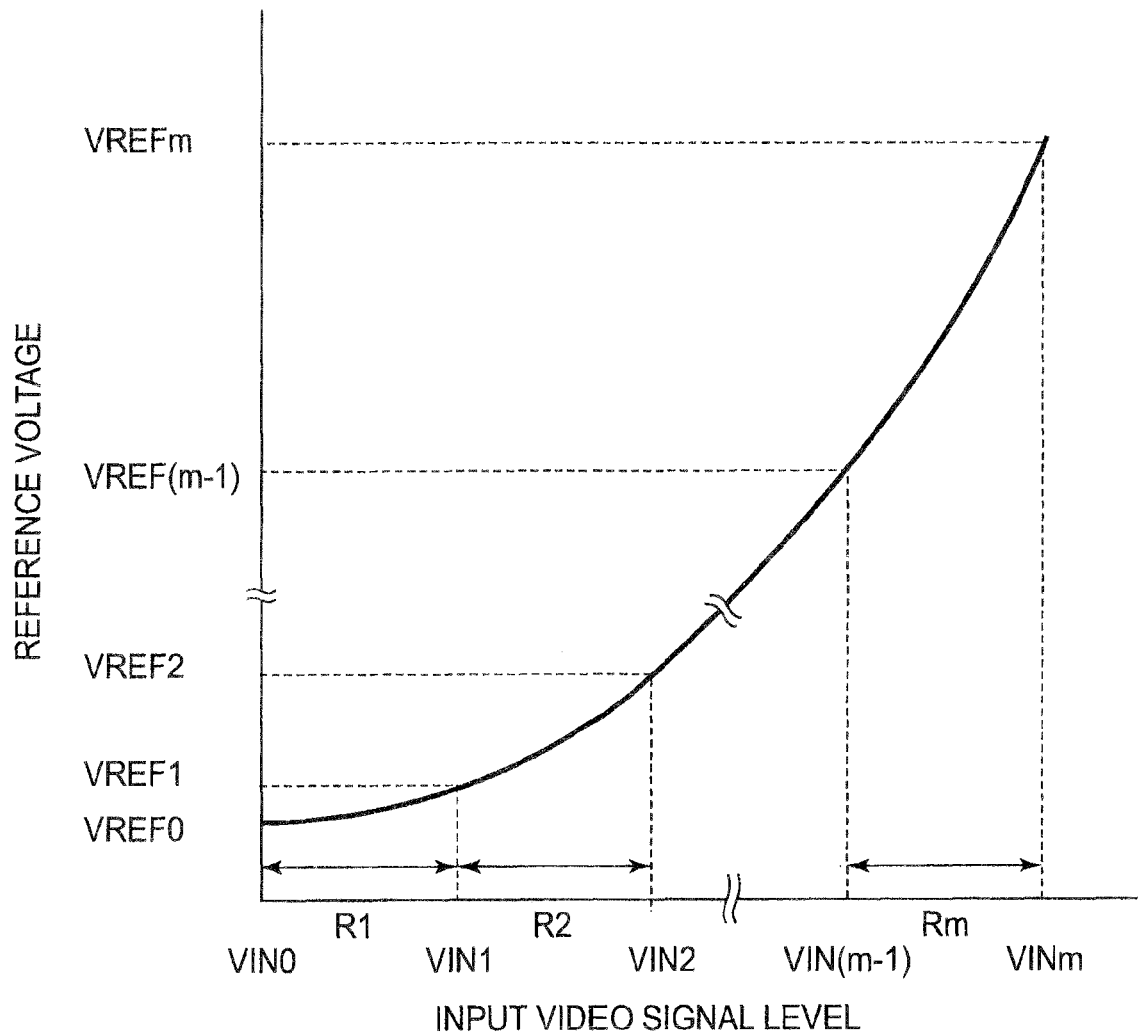
FIG. 4 is a graph showing reference voltage characteristics relative to input video signal levels of the light emitting element drive circuit using the current output type digital-analog conversion circuit according to the embodiment of the present invention.
Figure 5:
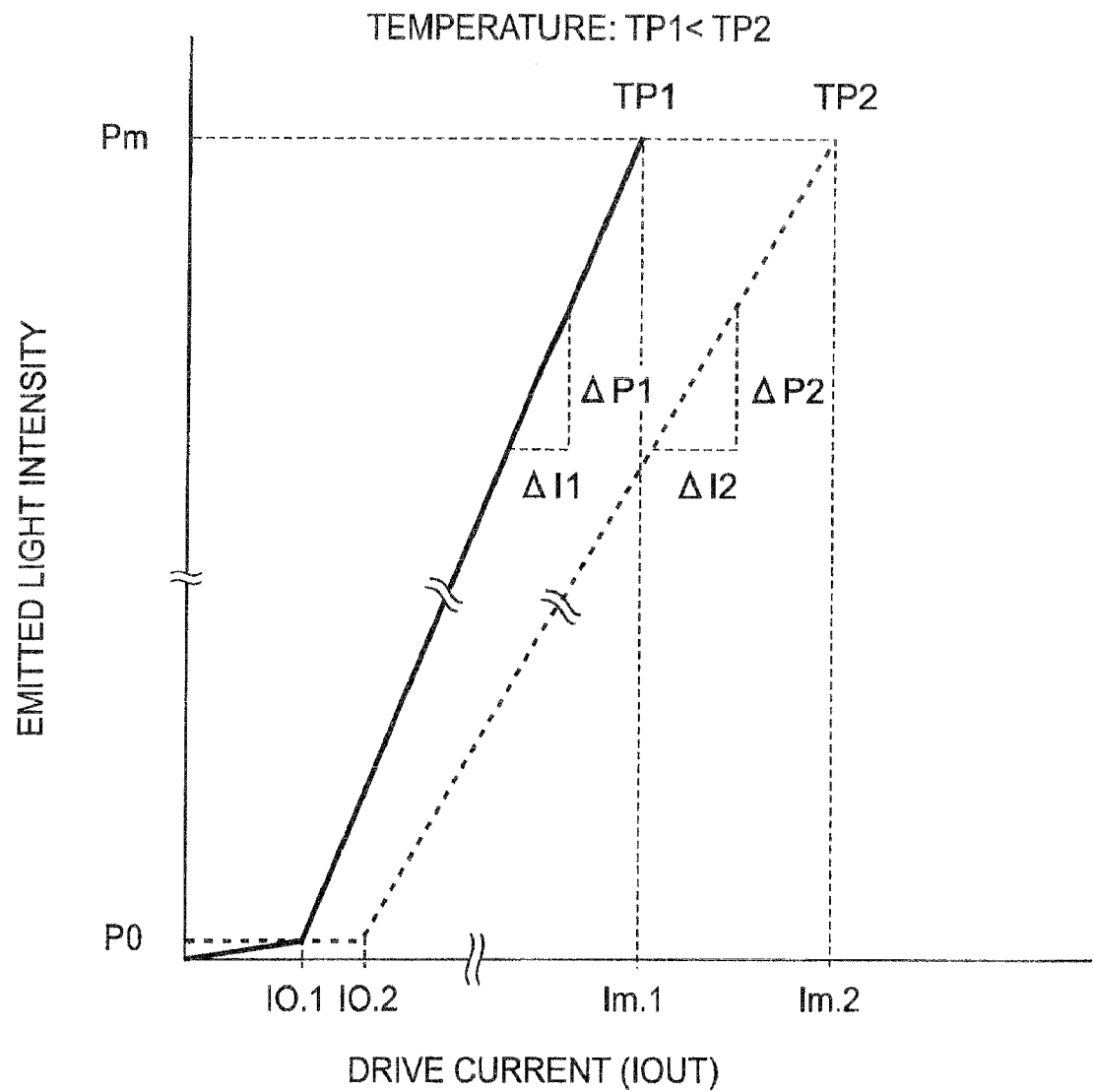
FIG. 5 is a graph showing light emission intensity characteristics relative to drive currents of a light emitting element according to temperatures in the light emitting element drive circuit using the current output type digital-analog conversion circuit according to the embodiment of the present invention.
Figure 6:
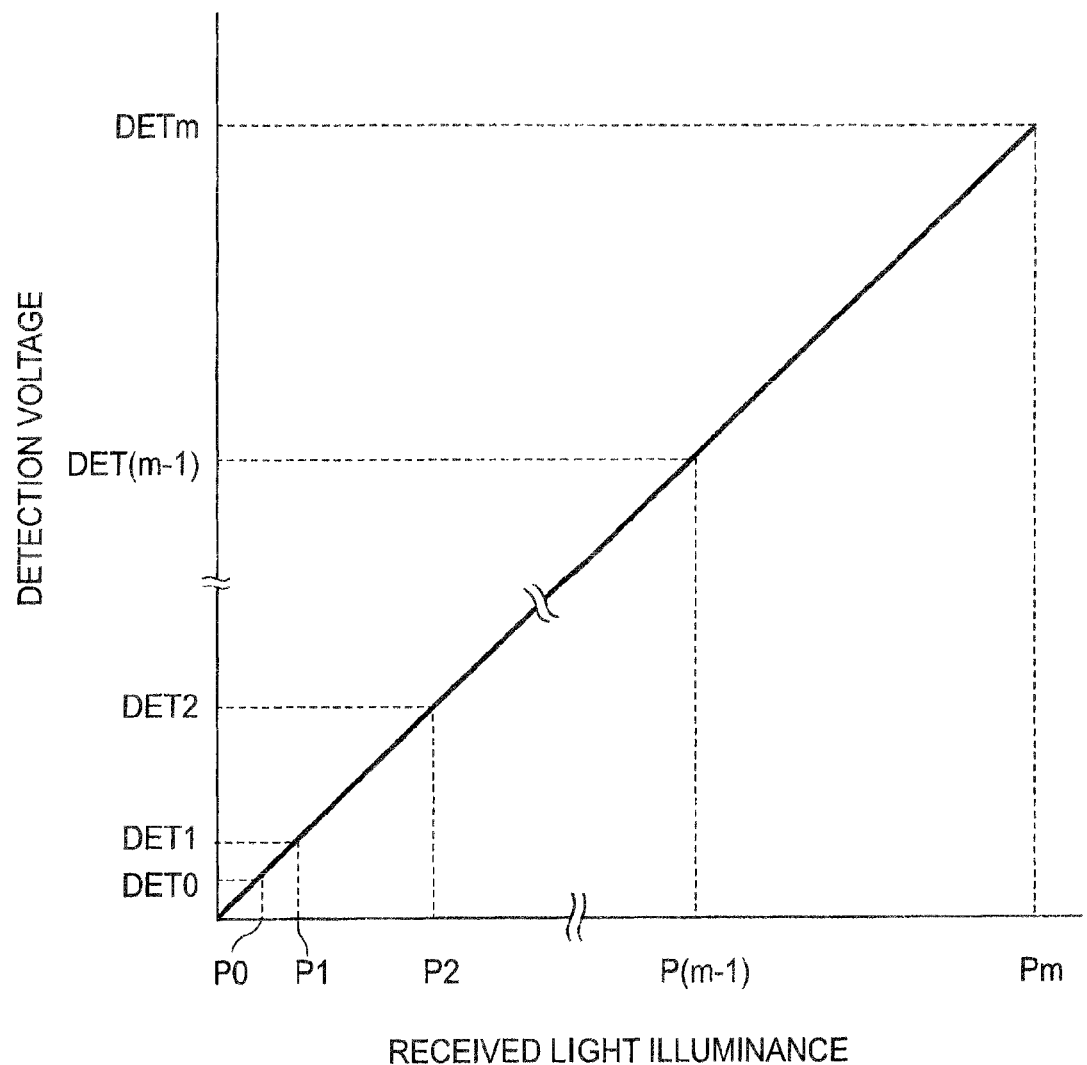
FIG. 6 is a graph showing output current characteristics relative to received light illuminances of a photo-detection element in the light emitting element drive circuit using the current output type digital-analog conversion circuit according to the embodiment of the present invention.
Figure 7:
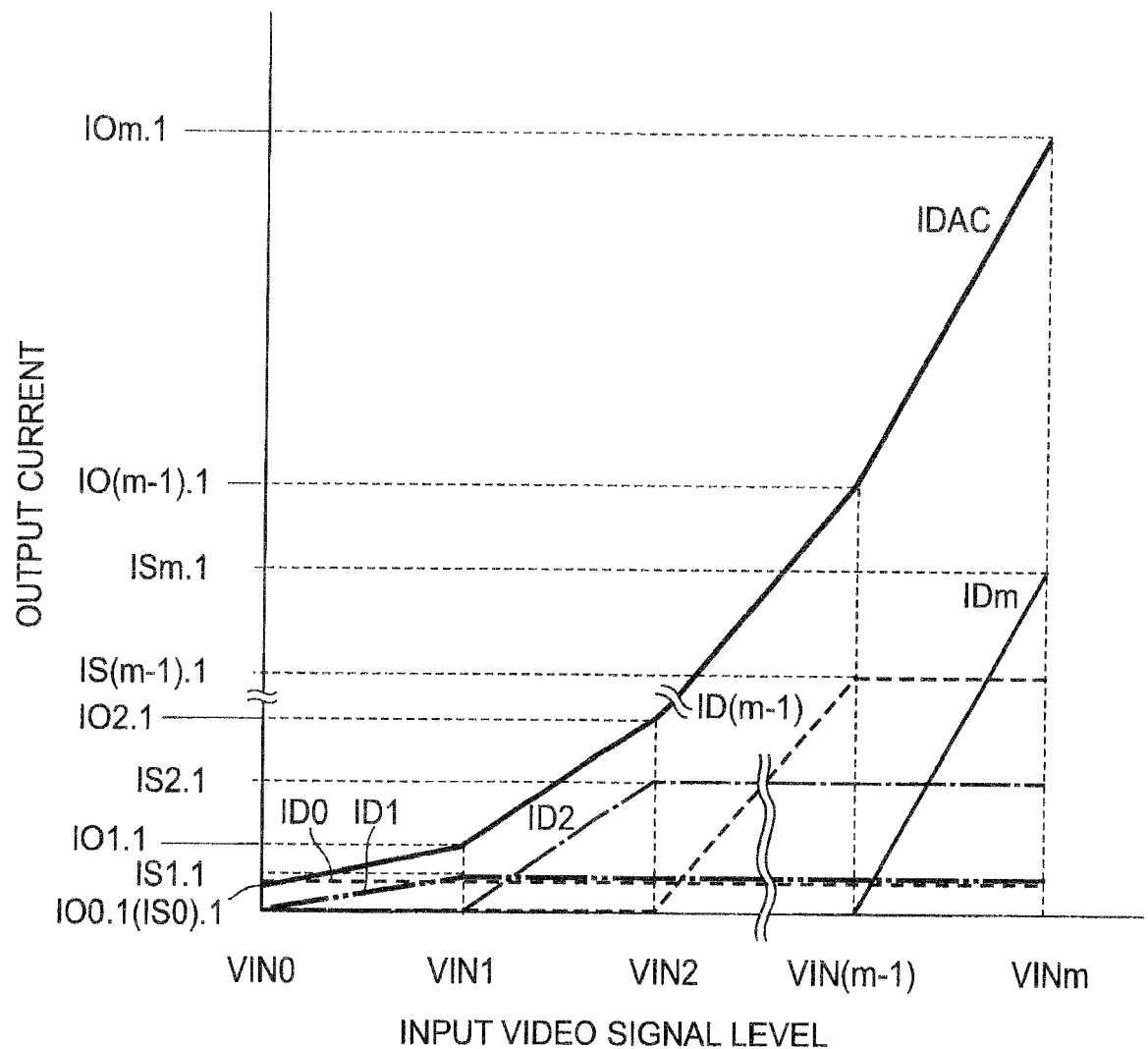
FIG. 7 is a graph showing output current characteristics relative to input video signal levels at temperature TP1 of the current output type digital-analog conversion circuit, in the light emitting element drive circuit using the current output type digital-analog conversion circuit according to the embodiment of the present invention.
Figure 8:
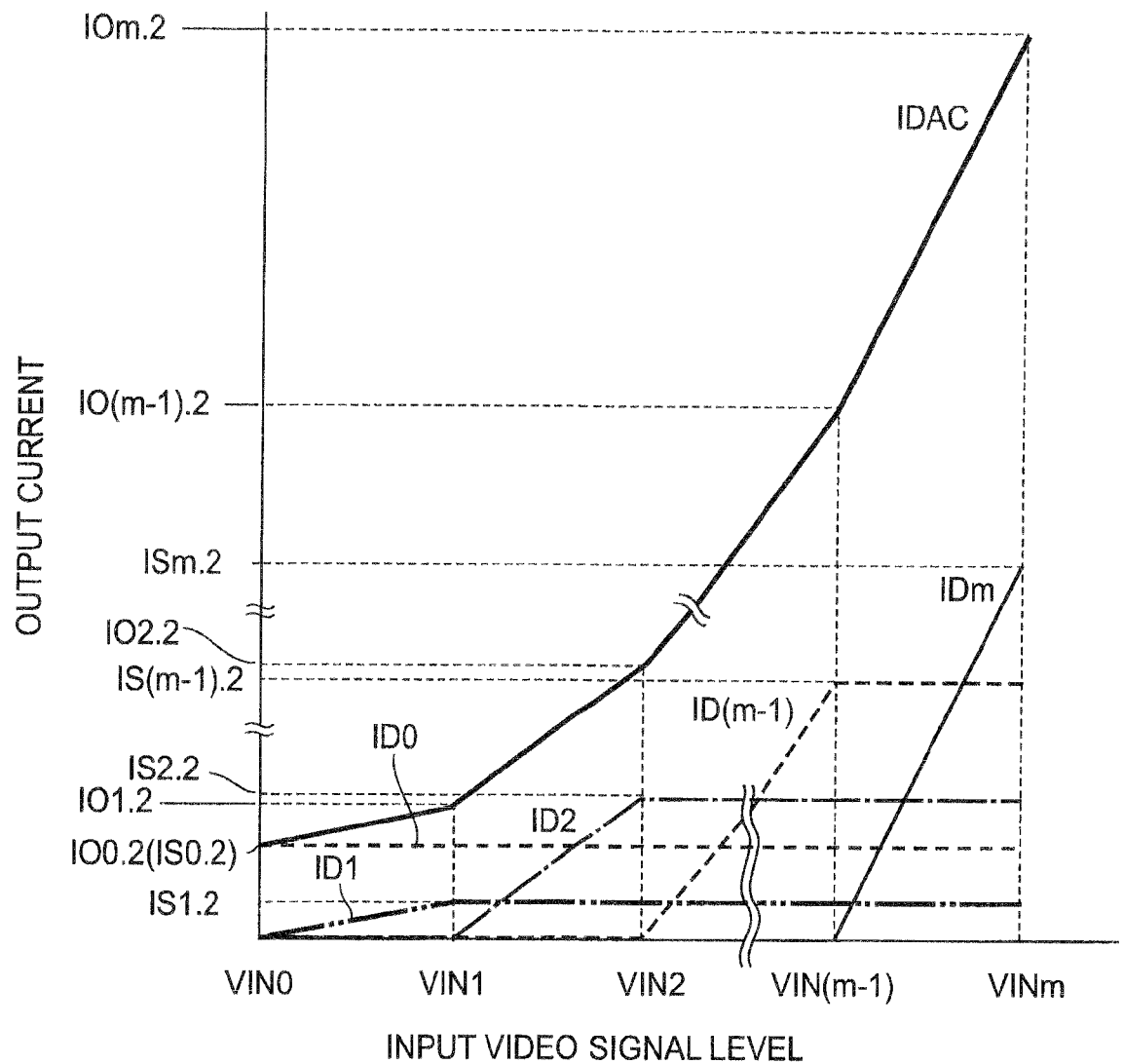
FIG. 8 is a graph showing output current characteristics relative to input video signal levels at temperature TP2 of the current output type digital-analog conversion circuit, in the light emitting element drive circuit using the current output type digital-analog conversion circuit according to the embodiment of the present invention.
Figure 9:
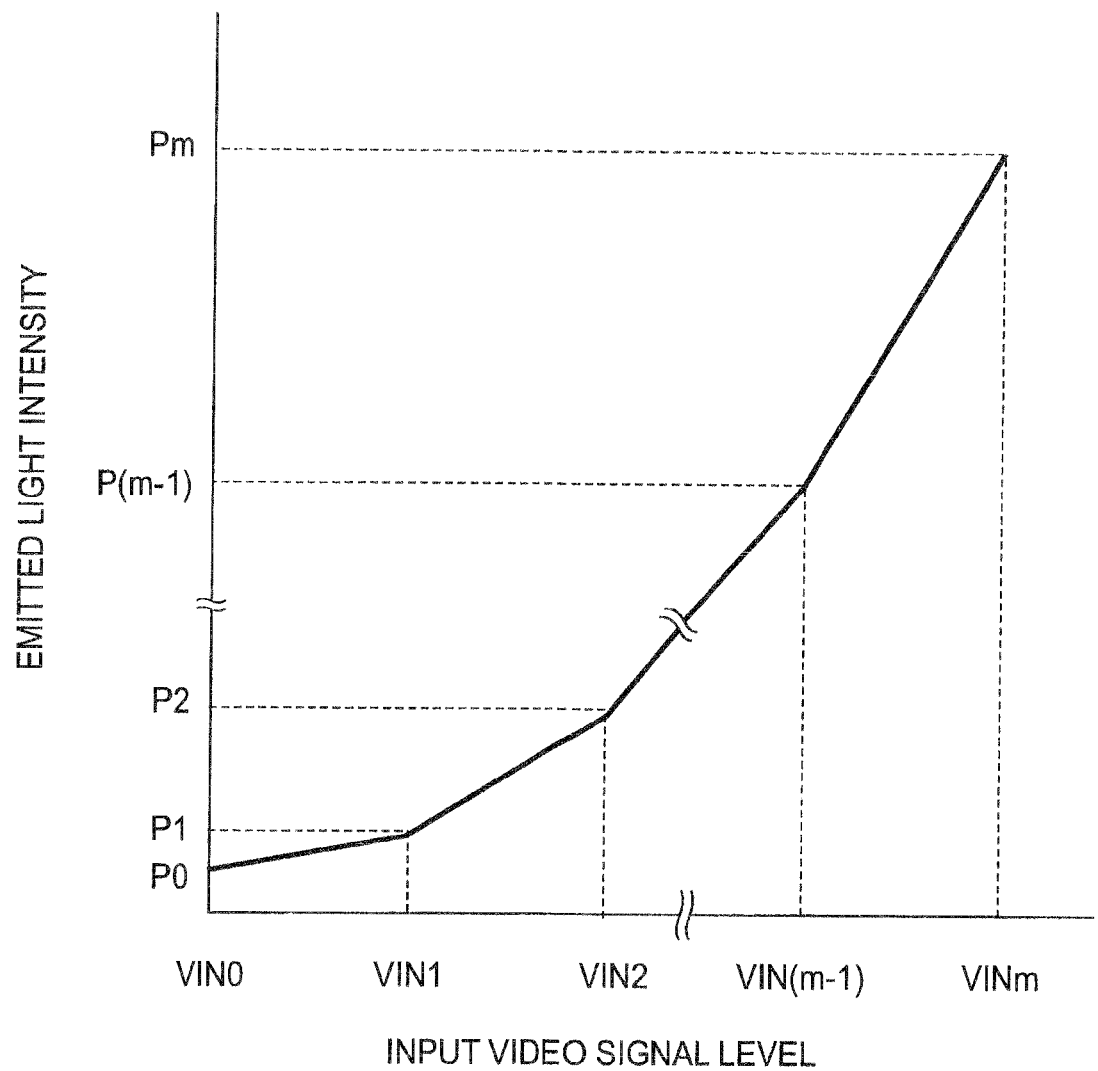
FIG. 9 is a graph showing light emission intensity characteristics relative to input video signal levels of the light emitting element drive circuit using the current output type digital-analog conversion circuit according to the embodiment of the present invention.

FIG. 3 is a block diagram showing a configuration of a light emitting element drive circuit using the current output type digital-analog conversion circuit. FIG. 4 to FIG. 9 are graphs illustrating characteristics of the light emitting element drive circuit. FIG. 4 shows reference voltage characteristics relative to input video signal levels, FIG. 5 shows light emission intensity characteristics relative to drive current of the light emitting element 14, FIG. 6 shows output current characteristics relative to received light illuminance of the photo-detection element 15, FIG. 7 shows output current characteristics relative to input video signal levels at temperature TP1, FIG. 8 shows output current characteristics relative to input video signal levels at temperature TP2, and FIG. 9 shows light emission intensity characteristics relative to input video signal levels.

FIG. 3 is a block diagram showing an overall configuration of a light emitting element drive circuit as an application of the embodiment of the present invention. The reference numerals 11-1 to 11-n denote input terminals for input digital data, 12 denotes a current output type digital-analog conversion circuit according to the embodiment of the present invention, 13 denotes a drive current output unit, 14 denotes a light emitting element, 15 denotes a light intensity detector, 16-1 to 16-(m+1) denote reference voltages, 17-1 to 17-(m+1) denote comparators, and 18 denotes a sample hold circuit.

In FIG. 4, the reference voltage has gamma characteristics in relation to the input video signal level. The relationship is established such that the reference voltage VREF0 corresponds to reference voltage 1 at the video signal level VIN0, the reference voltage VREF1 corresponds to reference voltage 2 at the video signal level VIN1, . . . , the reference voltage VREF(m−1) corresponds to reference voltage m at the video signal level VIN(m−1), and the reference voltage VREFm corresponds to reference voltage m+1 at the video signal level VINm. The curve in FIG. 4 is divided into m regions of R1 to Rm.

Operation of each block is as follows. The current output type digital analog conversion circuit 12 outputs a current IDAC according to input digital data. This output current is controlled by control voltages CNT0 to CNTm from the sample hold circuit 18. The drive current output unit 13 outputs a current IOUT proportional to the current IDAC. As seen from the light emission intensity characteristics shown in FIG. 5, the light emitting element 14 emits substantially no light when the drive current is equal to or lower than a threshold current (I0), whereas when the drive current is equal to or higher than the threshold current, the light emitting element 14 emits light with a high intensity proportional to the drive current. Further, the light emitting element 14 has characteristics that the threshold current and the gradient ($\Delta P/\Delta I$) vary in accordance with the temperature.

The light intensity detector 15 outputs a detection voltage DET which increases linearly relative to the received light illuminance as shown in FIG. 6. The comparators 17-1 to 17-(m+1) compare the detection voltage DET0 with the reference voltages 1(VREF0) to m+1(VREFm) and output difference voltages. The sample hold circuit 18 samples the difference voltages output by the comparators 17-1 to 17-(m+1) at a predetermined timing. The sample hold circuit 18 passes through and outputs the input voltages as output voltages CNT0 to CNTm during the sampling, whereas holds and outputs the voltage value at the time of sampling when the sampling is not performed.

Operation at the temperature TP1 is as described below. At a certain time T1, the input video signal is VIN0, and the current output type digital-analog conversion circuit 12 outputs an output current IO0.1. The drive current output unit 13 outputs a drive current I0.1 proportional to the current IO0.1 to supply the same to the light emitting element 14. The light emitting element 14 emits light having an intensity P0 according to the drive current I0.1. The light intensity detector 15 outputs a detection voltage DET0 according to the light intensity P0, and supplies the same to the comparator 17-1. The comparator 17-1 compares the detection voltage DET0 with the reference voltage 1 (VREF0), and outputs a difference voltage. The sample hold circuit 18 samples this difference voltage, and outputs it as a control voltage CNT0 to the current output type digital-analog conversion circuit 12. The current output type digital-analog conversion circuit 12 controls the output current IO0.1 based on this control voltage CNT0.

Thus, at the time T1, an APC loop is formed, consisting of, in sequence, the current output type digital-analog conversion circuit 12, the drive current output unit 13, the light emitting element 14, the light intensity detector 15, the detection voltage DET0, the comparator 17-1, the difference voltage, the sample hold circuit 18, the control voltage CNT0, and the current output type digital-analog conversion circuit 12. A value of the control voltage CNT0 is determined by this APC loop such that the light emitting element 14 emits light with the intensity P0 which is arbitrarily determined by the reference voltage VREF0.

Next, at certain time T2, the input signal is VIN1, and the current output type digital-analog conversion circuit 12 outputs an output current IO1.1. The drive current output unit 13 outputs a drive current I1.1 and supplies the same to the light emitting element 14. The light emitting element 14 emits light with an intensity P1 according to the drive current I1.1. The light intensity detector 15 outputs a detection voltage DET1 according to the light intensity P1 and supplies the same to the comparator 17-2. The comparator 17-2 compares the detection voltage DET1 with the reference voltage 2(VREF1) and outputs a difference voltage. The sample hold circuit 18 samples this difference voltage and outputs, as a control voltage CNT1, to the current output type digital-analog conversion circuit 12. The current output type digital-analog conversion circuit 12 controls the output current IO1.1 based on this control voltage.

Thus, at the time T2, an APC loop is formed, consisting of, in sequence, the current output type digital-analog conversion circuit 12, the drive current output unit 13, the light emitting element 14, the light intensity detector 15, the detection voltage DET1, the comparator 17-2, the difference voltage, the sample hold circuit 18, the control voltage CNT1, and the current output type digital-analog conversion circuit 12. A value of the control voltage value is determined by this APC loop such that the light emitting element 14 emits light with the intensity P1 which is arbitrarily determined by the reference voltage VREF1.

In this manner, the APC control is performed by switching the input signal and the reference voltage associated with the input signal. The control voltages CNT0 to CNTm output by the sample hold circuit are determined such that the light emitting element 14 emits light with the intensities P0 to Pm arbitrarily determined by the reference voltages VREF0 to VREFm. As a result the output current IDAC of the current output type digital-analog conversion circuit 12 assumes characteristics as shown in FIG. 7 in relation to the input video signal level. Further, since the reference voltages VREF0 to VREFm have gamma characteristics in relation to the input signal levels, the light emission intensity of the light emitting element 14 also has gamma characteristics relative to the input signal levels, as shown in FIG. 9.

Next, operation at temperature TP2 becomes as follows. At a certain time T1, the input signal is VIN0, and the current output type digital-analog conversion circuit 12 outputs an output current IO0.2. The drive current output unit 13 outputs a drive current I0.2 proportional to the current IO0.2 and supplies the same to the light emitting element 14. The light emitting element 14 emits light having an intensity P0 according to the drive current I0.2. The light intensity detector 15 outputs a detection voltage DET0 according to the light intensity P0 and supplies the same to the comparator 17-1. The comparator 17-1 compares the detection voltage DET0 with the reference voltage 1(VREF0) and outputs a difference voltage. The sample hold circuit 18 samples this difference voltage and outputs as a control voltage CNT0 to the current output type digital-analog conversion circuit 12. The current output type digital-analog conversion circuit 12 controls the output current IO0.2 based on this control voltage CNT0.

At the time T1, an APC loop is formed consisting of, in sequence, the current output type digital-analog conversion circuit 12, the drive current output unit 13, the light emitting element 14, the light intensity detector 15, the detection voltage DET0, the comparator 17-1, the difference voltage, the sample hold circuit 18, the control voltage CNT0, and the current output type digital-analog conversion circuit 12. The value of the control voltage CNT0 at this time is determined by the APC loop such that the light emitting element 14 emits light having the intensity P0 which is arbitrarily determined by the reference voltage VREF0.

Accordingly, even if the temperature varies from TP1 to TP2, the light emitting element 14 is caused to emit light having the intensities P0 to Pm which are arbitrarily determined by the reference voltages VREF0 to VREFm, by the control voltages CNT0 to CNTm output by the sample hold circuit. Therefore, the output current from the current output type digital-analog conversion circuit 12 has gamma characteristics relative to the input video signal level as shown in FIG. 8. As a result, the circuit of the present invention operates such that, even if the temperature varies, the light emitting element 14 emits light with a constant intensity relative to a certain input level, and at the same time the light emission intensity of the light emitting element 14 has gamma characteristics relative to the input signal level.

According to the present invention, as described above, a gamma-corrected current output type digital-analog conversion circuit can be obtained, which is capable of reducing the circuit scale as well as the chip area. Further, a light emitting element drive circuit can be obtained, employing this current output type digital-analog conversion circuit. Specific examples of circuit configurations will be described as examples.

EXAMPLE 1

Figure 10:
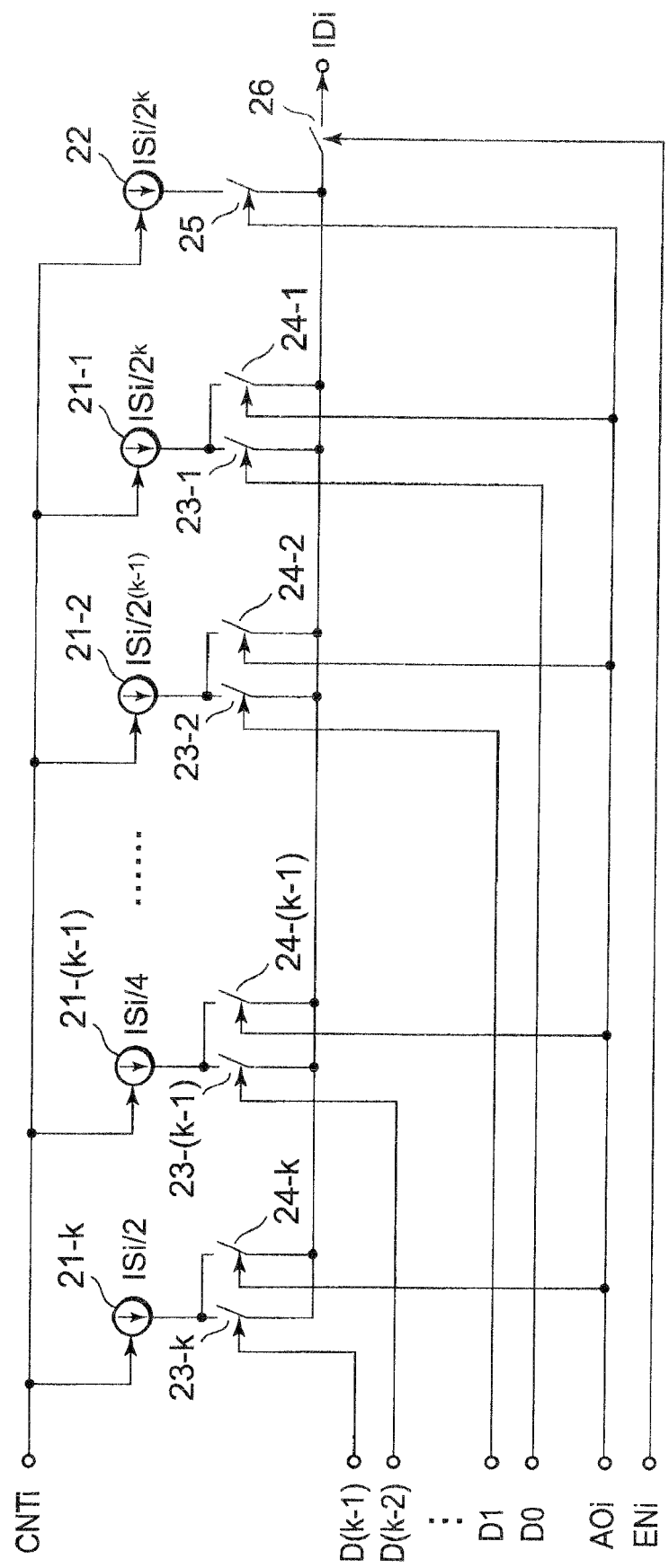
FIG. 10 is a block diagram showing a configuration of a binary current DAC forming a current output type digital-analog conversion circuit according to a first example of the present invention.

As example 1, a specific example of circuits forming the current output type digital-analog conversion circuit according to the embodiment of the present invention will be described with reference to the drawings. FIG. 10 is a block diagram showing a configuration of a binary current generator forming the current output type digital-analog conversion circuit according to the first example of the present invention.

The binary current generator is composed of binary current sources denoted by 21-1 to 21-k, a carry current source denoted by 22, bit switches for input digital data D0 to D(k−1) denoted by 23-1 to 23-k, binary current source all-ON switches denoted by 24-1 to 24-k, a carry current source all-ON switch denoted by 25, and an output enable switch denoted by 26.

Next, operation of the binary current generator according to the first example will be described. Each block operates as described below. A current value of each current source has characteristics to increase binarily. Specifically, the binary current source 21-1 assumes a current value of $ISi/2^k$, the current source 21-2 assumes a current value of $ISi/2^{(k-1)}$, ..., the current source 21-(k−1) assumes a current value of $ISi/2^2$, and the current source 21-k assumes a current value of $ISi/2$. The carry current source 22 assumes a current value of $ISi/2^k$ corresponding to the LSB. The output currents from the binary current sources 21-1 to 21-k and the carry current source 22 are adjustable by means of a control signal CNTi.

The bit switches 23-1 to 23-k are turned OFF when the input digital data D0 to D(k−1) are zero, and turned ON when the input digital data D0 to D(k−1) are one. The binary current source all-ON switches 24-1 to 24-k and the carry current source all-ON switch 25 are turned OFF when the all-ON signal input AOi is an OFF signal, and turned ON when the all-ON signal input AOi is an ON signal. The output enable switch 26 is turned OFF when the enable signal input ENi is an OFF signal, and turned ON when the enable signal input ENi is an ON signal.

Accordingly, the binary current generator according to the first example of the present invention outputs a current IDi which increases linearly as binary values according to the input digital data D0 to D(k−1) when the enable signal input ENi is ON. When the enable signal input ENi is OFF, the output current IDi becomes zero. When the all-ON signal input AOi is ON, the binary current generator is supplied with all the currents from the binary current sources 21-1 to 21-k and the carry current source 22 and outputs the current value ISi. The output current IDi is adjustable by the control signal CNTi.

Accordingly, the current output type digital-analog conversion circuit formed of the binary current generator according to the first example of the invention has similar functions to those of the current output type digital-analog conversion circuit according to the embodiment of the present invention shown in FIG. 1. Specifically, the output current IDAC of the current output type digital-analog conversion circuit has characteristics as shown in FIG. 2 in relation to the input video signal level VIN. Here, the output current values IS1 to ISm of the binary current generators 2-1 to 2-m are set such that the output current values IO0 to IOm corresponding to the video signal levels VIN0 to VINm of the current output type digital-analog conversion circuit are proportional to 2.2-th power of decimal values of the video signal levels VIN0 to VINm. This setting enables the current output type digital-analog conversion circuit to output a gamma-corrected output current IDAC. Further, the light emitting element drive circuit using the current output type digital-analog conversion circuit according to the first example of the present invention functions such that even if the temperature varies, light emission intensity of the light emitting element is kept constant at a certain input level. At the same time, the light emitting element drive circuit functions such that the light emission intensity of the light emitting element has gamma characteristics in relation to the input signal levels.

EXAMPLE 2

Figure 11:
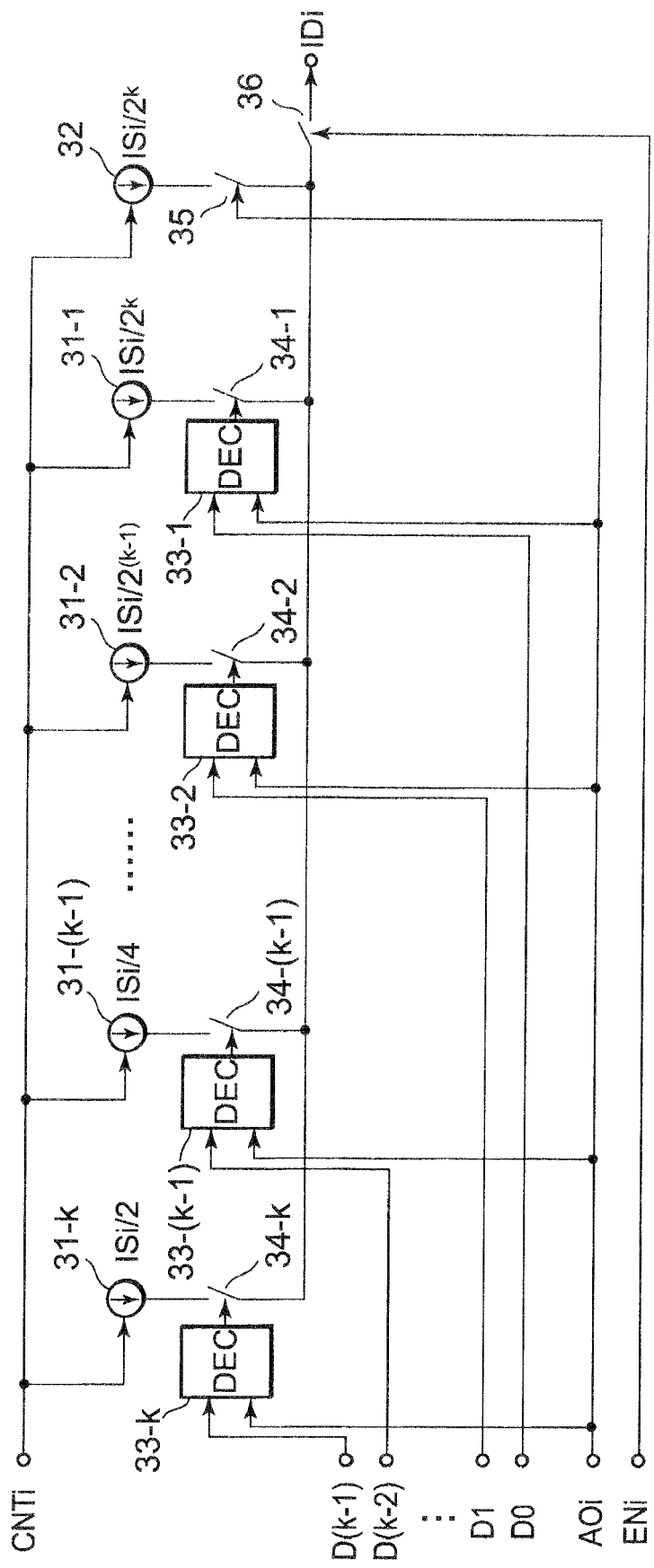
FIG. 11 is a block diagram showing a configuration of a binary current DAC forming a current output type digital-analog conversion circuit according to a second example of the present invention.

A configuration of a second circuit block of the binary current generator will be described as Example 2, with reference to the drawing. FIG. 11 is a block diagram showing a configuration of the second binary current generator of the present invention. Table 2 below describes relationship among the all-ON signal input, the input digital data, and the decoder output. The second binary current generator is composed of binary current sources denoted by 31-1 to 31-k, a carry current source denoted by 32, decoders denoted by 33-1 to 33-k, bit switches denoted by 34-1 to 34-k, a carry current source all-ON switch denoted by 35, and an output enable switch denoted by 36.

TABLE 2

| AOi | Dj | DEC OUT |
|---|---|---|
| OFF | 0 | OFF |
| OFF | 1 | ON |
| ON | 0 | ON |
| ON | 1 | ON |

Next, operation of the binary current generator according to the second example of the present invention will be described. Each block operates as described below. The decoders 33-1 to 33-k output an OFF signal when the all-ON signal input AOi is an OFF signal and the input digital data Di is zero as shown in Table 2, whereas outputs an ON signal under the other input conditions. The bit switches 34-1 to 34-k are turned OFF when the decoders 33-1 to 33-k output an OFF signal, and are turned ON when the decoders 33-1 to 33-k output an ON signal. The binary current sources 31-1 to 31-k, the carry current source 32, the bit switches 34-1 to 34-k, the carry current source all-ON switch 35, and the output enable switch 36 operate in the same manner as the first example.

Accordingly, the binary current generator according to the second example of the present invention has the same functions as the binary current generator according to the first example.

EXAMPLE 3

Figure 12:
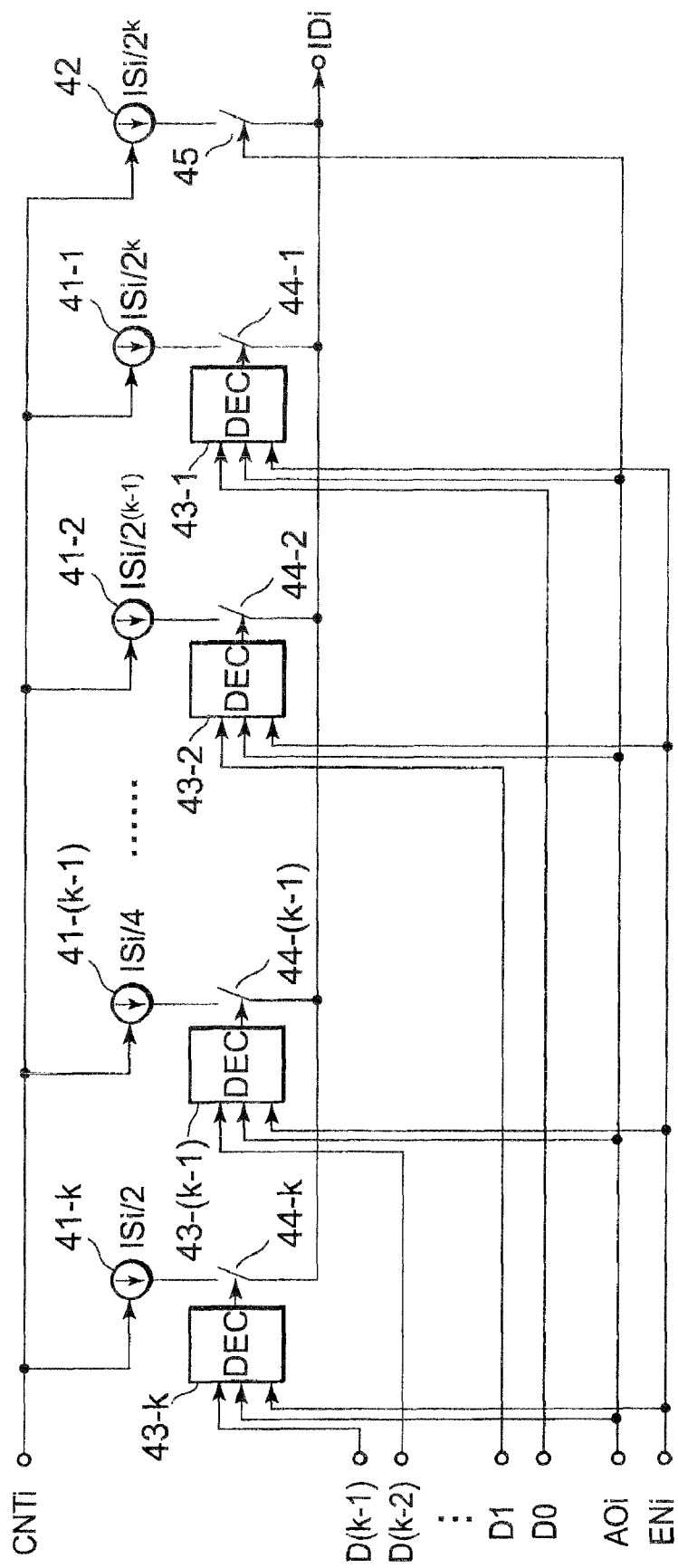
FIG. 12 is a block diagram showing a configuration of a binary current DAC forming a current output type digital-analog conversion circuit according to a third example of the present invention.

A configuration of a third circuit block of the binary current generator will be described as Example 3, with reference to the drawings. FIG. 12 is a block diagram showing a configuration of a binary current generator according to the third example of the present invention. Table 3 below describes relationship among the enable signal input, the all-ON signal input, the input digital data, and the decoder output. The third binary current generator is composed of binary current sources denoted by 41-1 to 41-k, a carry current source denoted by 42, decoders denoted by 43-1 to 43-k, bit switches denoted by 44-1 to 44-k, and a carry current source all-ON switch denoted by 45.

TABLE 3

| ENi | AOi | Dj | DEC OUT |
|---|---|---|---|
| OFF | OFF | 0 | OFF |
| OFF | OFF | 1 | OFF |
| OFF | ON | 0 | — |
| OFF | ON | 1 | — |
| ON | OFF | 0 | OFF |
| ON | OFF | 1 | ON |
| ON | ON | 0 | ON |
| ON | ON | 1 | ON |

Next, operation of the binary current generator according to the third example of the present invention will be described. Each block operates as described below. The decoders 43-1 to 43-k output an OFF signal when the enable signal input ENi is an OFF signal and the all-ON signal input AOi is an OFF signal as shown in Table 3. The decoders 43-1 to 43-k output an OFF signal when the enable signal input ENi is an ON signal, the all-ON signal input AOi is an OFF signal, and the input digital data Di is zero.

The decoders 43-1 to 43-k output an ON signal when the enable signal input ENi is an ON signal, the all-ON signal input AOi is an OFF signal, and the input digital data Di is one. The decoders 43-1 to 43-k output an ON signal when the enable signal input ENi is an ON signal, and the all-ON signal input AOi is an ON signal. The binary current sources 41-1 to 41-k, the carry current source 42, the bit switches 44-1 to 44-k, and the carry current source all-ON switch 45 operate in the same manner as the first example.

Accordingly, the third binary current generator according to the third example of the present invention has the same functions as the binary current generator according to the first example.

EXAMPLE 4

Figure 13:
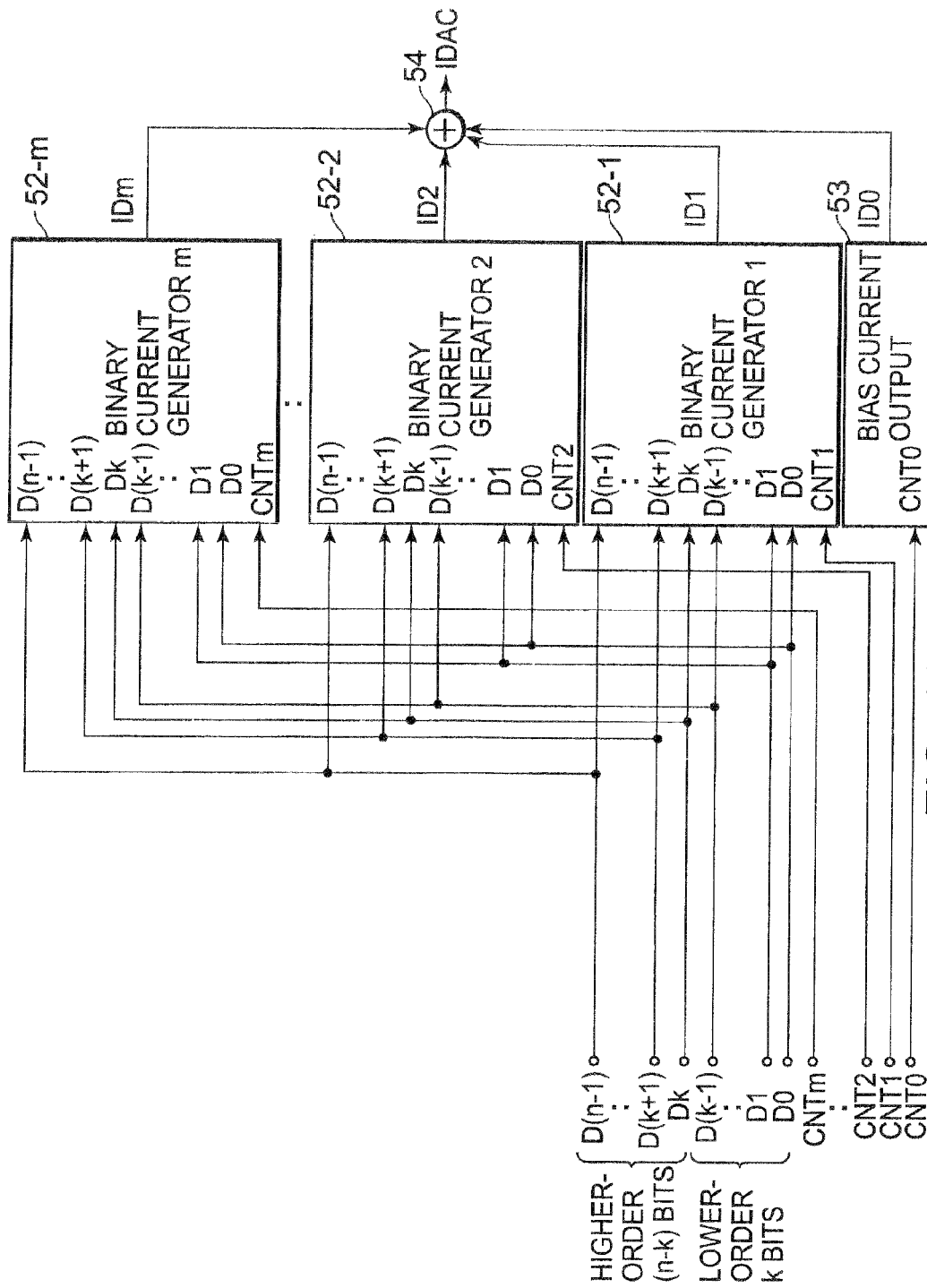
FIG. 13 is a block diagram showing a configuration of a current output type digital-analog conversion circuit according to a fourth example of the present invention.
Figure 14:
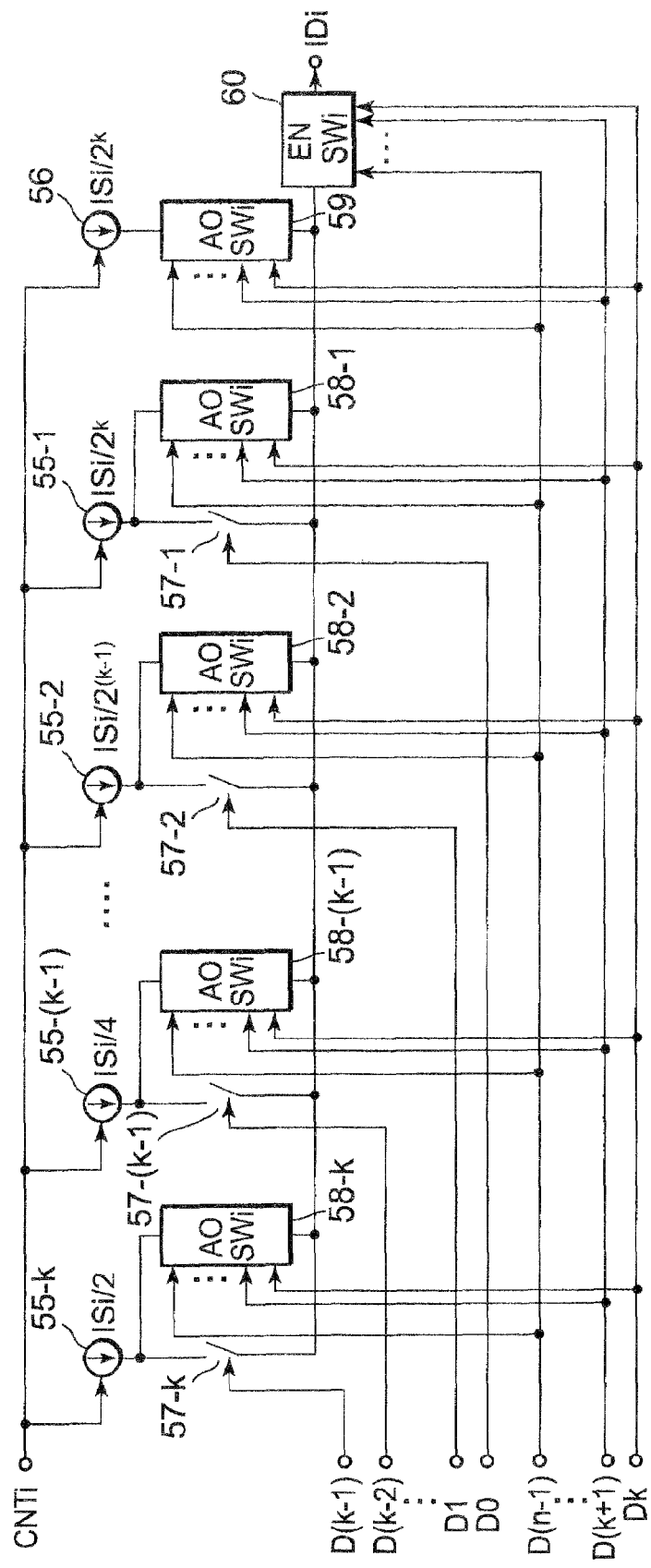
FIG. 14 is a block diagram showing a configuration of a binary current DAC forming the current output type digital-analog conversion circuit according to the fourth example of the present invention.

A second current output type digital-analog conversion circuit will be described as Example 4, with reference to the drawings. FIG. 13 is a block diagram showing a configuration of the second current output type digital-analog conversion circuit. FIG. 14 is a block diagram showing a configuration of the binary current generator of FIG. 13. Table 4 describes a relationship between higher-order (n-k) bits Dk to D(n−1) of the input digital data and operation of the all-ON switches, and Table 5 describes a relationship between the higher-order (n-k) bits Dk to D(n−1) of the input digital data and operation of the output enable switches.

The second current output type digital-analog conversion circuit is composed of binary current generators 1 to m denoted by 52-1 to 52-m, a bias current output circuit denoted by 53, and a current adder denoted by 54. The binary current generators 52-1 to 52-m are each composed of binary current sources denoted by 55-1 to 55-k, a carry current source denoted by 56, bit switches denoted by 57-1 to 57-k, all-ON switches denoted by 58-1 to 58-k and 59, and an output enable switch denoted by 60.

Next, referring to Tables 4 and 5, operation of the binary current generator according to the fourth example of the invention will be described. Table 4 shows a relationship between higher-order (n-k) bits Dk to D(n−1) of input digital data and operation of the all-ON switches, and Table 5 shows a relationship between the higher-order (n-k) bits Dk to D(n−1) of the input digital data and operation of the output enable switches. Each block operates as described below.

TABLE 4

| Higher-order (n − k) bits | | | | | | | |
|---|---|---|---|---|---|---|---|
| D(n − 1) | 0 | 0 | 0 | ... | 1 | 1 | 1 |
| D(n − 2) | 0 | 0 | 0 | ... | 1 | 1 | 1 |
| ... | | | | ... | | | |
| D(k + 1) | 0 | 0 | 1 | ... | 0 | 1 | 1 |
| Dk | 0 | 1 | 0 | ... | 1 | 0 | 1 |
| AOSWm | OFF | OFF | OFF | ... | OFF | OFF | OFF |
| AOSW(m − 1) | OFF | OFF | OFF | ... | OFF | OFF | ON |
| AOSW(m − 2) | OFF | OFF | OFF | ... | OFF | ON | ON |
| ... | | | | ... | | | |
| AOSW3 | OFF | OFF | OFF | ... | ON | ON | ON |
| AOSW2 | OFF | OFF | ON | ... | ON | ON | ON |
| AOSW1 | OFF | ON | ON | ... | ON | ON | ON |

TABLE 5

| Higher-order (n − k) bit | | | | | | | |
|---|---|---|---|---|---|---|---|
| D(n − 1) | 0 | 0 | 0 | ... | 1 | 1 | 1 |
| D(n − 2) | 0 | 0 | 0 | ... | 1 | 1 | 1 |
| ... | | | | ... | | | |
| D(k + 1) | 0 | 0 | 1 | ... | 0 | 1 | 1 |
| Dk | 0 | 1 | 0 | ... | 1 | 0 | 1 |
| ENSWm | OFF | OFF | OFF | ... | OFF | OFF | ON |
| ENSW(m − 1) | OFF | OFF | OFF | ... | OFF | ON | ON |
| ENSW(m − 2) | OFF | OFF | OFF | ... | ON | ON | ON |
| ... | | | | ... | | | |
| ENSW3 | OFF | OFF | ON | ... | ON | ON | ON |
| ENSW2 | OFF | ON | ON | ... | ON | ON | ON |
| ENSW1 | ON | ON | ON | ... | ON | ON | ON |

The all-ON switches 58-1 to 58-k, and 59 are turned ON when the higher-order (n-k) bits Dk to D(n−1) of the input digital data assume a predetermined bit pattern assigned to each of the binary current generators. Specifically, the all-ON switch AOSWi forming the binary current generator 52-i is turned OFF when the data Dk to D(n−1) are i−1 or less in decimal notation, and is turned ON when the data Dk to D(n−1) are i or more in decimal notation.

The output enable switch 60 is turned ON when the higher-order (n-k) bits Dk to D(n−1) of the input digital data assume a predetermined bit pattern assigned to each of the binary current generators. Specifically, the output enable switch ENSWi forming the binary current generator 52-i is turned OFF when the data Dk to D(n−1) are i−2 or less in decimal notation, and turned ON when the data Dk to D(n−1) are i−1 or more in decimal notation. The binary current sources 55-1 to 55-k, the carry current source 56, and the bit switches 57-1 to 57-k operate in the same manner as the first example.

Next, operation of the current output type digital-analog conversion circuit according to the fourth example of the invention will be described.

The operation becomes as described below when the input video signal level is VIN0, that is, when the input digital data is zero in decimal notation. Since the higher-order (n-k) bits of the input digital data are zero in decimal notation, the output enable switch ENSW1 of the binary current generator 52-1 is turned ON, while the output enable switches ENSW2 to ENSWm of the binary current generators 52-2 to 52-m are turned OFF. Thus, only the binary current generator 52-1 outputs a binary current according to the lower-order k bits. However, since the lower-order k bits are zero in decimal notation, the output current ID1 from the binary current generator 52-1 is zero. Therefore, only the output current value IS0 of the bias current output circuit 53 is output from the current adder 54, and the output current IDAC=IS0.

Next, the operation becomes as described below when the input video signal level is VINi (provided that 0≦i<m), that is, when the higher-order (n-k) bits of the input digital data are i in decimal notation and the lower-order k bits are zero in decimal notation. Since the higher-order (n-k) bits of the input digital data are i in decimal notation, the output enable switches ENSW1 to ENSWi and the all-ON switches AOSW1 to AOSWi of the binary current generators 52-1 to 52-i are both turned ON. In the binary current generator 52-(i+1), the output enable switch ENSW(i+1) is ON and the all-ON switch AOSW(i+1) is OFF. In the binary current generators 52-(i+2) to 52-m, the output enable switches ENSW(i+2) to ENSWm and the all-ON switches AOSW(i+2) to AOSWm are both turned OFF.

Accordingly, the output currents ID1 to IDi of the binary current generators 52-1 to 52-i are IS1 to ISi. The binary current generator 52-(i+1) outputs a binary current ID(i+1) according to the lower-order k bits. The binary current generators 52-(i+2) to 52-m output no current. However, since the lower-order k bits are zero in decimal notation, the output current ID(i+1) of the binary current generator 52-(i+1) is zero. Therefore, the current adder 54 adds up the output current value IS0 of the bias current output circuit 53 and the output current values IS1 to ISi of the binary current generators 52-1 to 52-i, and thus the output current IDAC=IS0+IS1+ . . . +ISi=IOi.

Next, the operation becomes as described below when the input video signal level is VINi or higher and lower than VIN(i+1) (provided that 0≦i<m), that is, when the higher-order (n-k) bits of the input digital data are i in decimal notation. Since the higher-order (n-k) bits of the input digital data are i in decimal notation, the output enable switches ENSW1 to ENSWi and the all-ON switches AOSW1 to AOSWi of the binary current generators 52-1 to 52-i are both turned ON. In the binary current generator 52-(i+1), the output enable switch ENSW(i+1) is ON and the all-ON switch AOSW(i+1) is OFF. In the binary current generators 52-(i+2) to 52-m, the output enable switches ENSW(i+2) to ENSWm and the all-ON switches AOSW(i+2) to AOSWm are both OFF.

Accordingly, the output currents ID1 to IDi of the binary current generators 52-1 to 52-i are IS1 to ISi. The binary current generator 52-(i+1) outputs a binary current ID(i+1) according to the lower-order k bits. The binary current generators 52-(i+2) to 52-m output no current. Therefore, the current adder 54 adds up the output current value IS0 of the bias current output circuit 53, the output current values IS1 to ISi of the binary current generators 52-1 to 52-i, and the output current ID(i+1) of the binary current generator 52-(i+1), and the output current IDAC=IS0+IS1+ . . . +ISi+ID(i+1).

Next, the operation becomes as described below when the input video signal level is VINm, that is, when the higher-order (n-k) bits of the input digital data are $2^{n-k}$ in decimal notation, and the lower-order k bits are $2^k$ in decimal notation. Since the higher-order (n-k) bits of the input digital data are $2^{n-k}$ in decimal notation, the output enable switches ENSW1 to ENSW(m−1) and the all-ON switches AOSW1 to AOSW(m−1) are both ON in the binary current generators 52-1 to 52-(m−1). In the binary current generator 52-m, the output enable switch ENSWm is ON and the all-ON switch AOSWm is OFF.

Accordingly, the output currents ID1 to ID(m−1) of the binary current generators 52-1 to 52-(m−1) assume the values of IS1 to IS(m−1). Since the lower-order k bits are $2^k$ in decimal notation, the output current IDm of the binary current generator 52-m assumes the value of ISm. Therefore, the current adder 54 adds up the output current value IS0 of the bias current output circuit 53, and the output current values IS1 to Ism of the binary current generators 52-1 to 52-m, and thus the output current IDAC=IS0+IS1+ . . . +ISm=IOm is obtained.

Consequently, the current output type digital-analog conversion circuit formed by the binary current generators according to the fourth example of the invention has similar functions to those of the current output type digital-analog conversion circuit according to the embodiment of the invention shown in FIG. 1.

Specifically, the output current IDAC of the current output type digital-analog conversion circuit has characteristics as shown in FIG. 2 in relation to the input video signal level VIN. Thus, the current output type digital-analog conversion circuit is enabled to output gamma-corrected output current IDAC by setting the output current values IS1 to Ism of the binary current generators 52-1 to 52-m such that the output current values IO0 to IOm of the current output type digital-analog conversion circuit corresponding to the video signal levels VIN0 to VINm are proportional to 2.2-th power of decimal values of the video signal levels VIN0 to VINm.

Further, a light emitting element drive circuit using the current output type digital-analog conversion circuit according to the fourth example of the invention operates such that the light emission intensity of the light emitting element is kept constant relative to a certain input level even if the temperature varies, and at the same time, the light emission intensity of the light emitting element has gamma characteristics relative to the input signal level.

EXAMPLE 5

Figure 15:
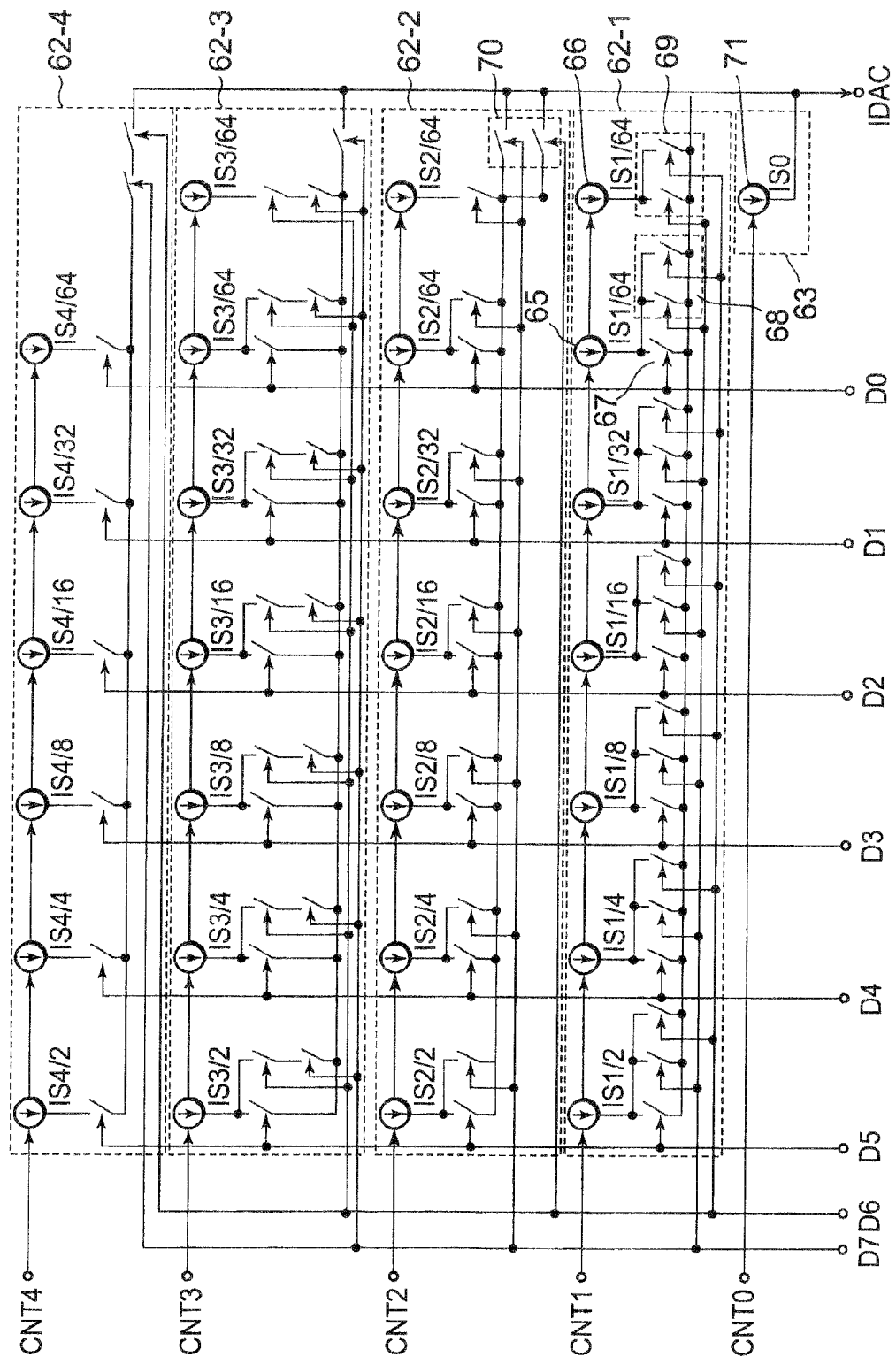
FIG. 15 is a block diagram showing a configuration of a current output type digital-analog conversion circuit according to a fifth example of the present invention.
Figure 16:
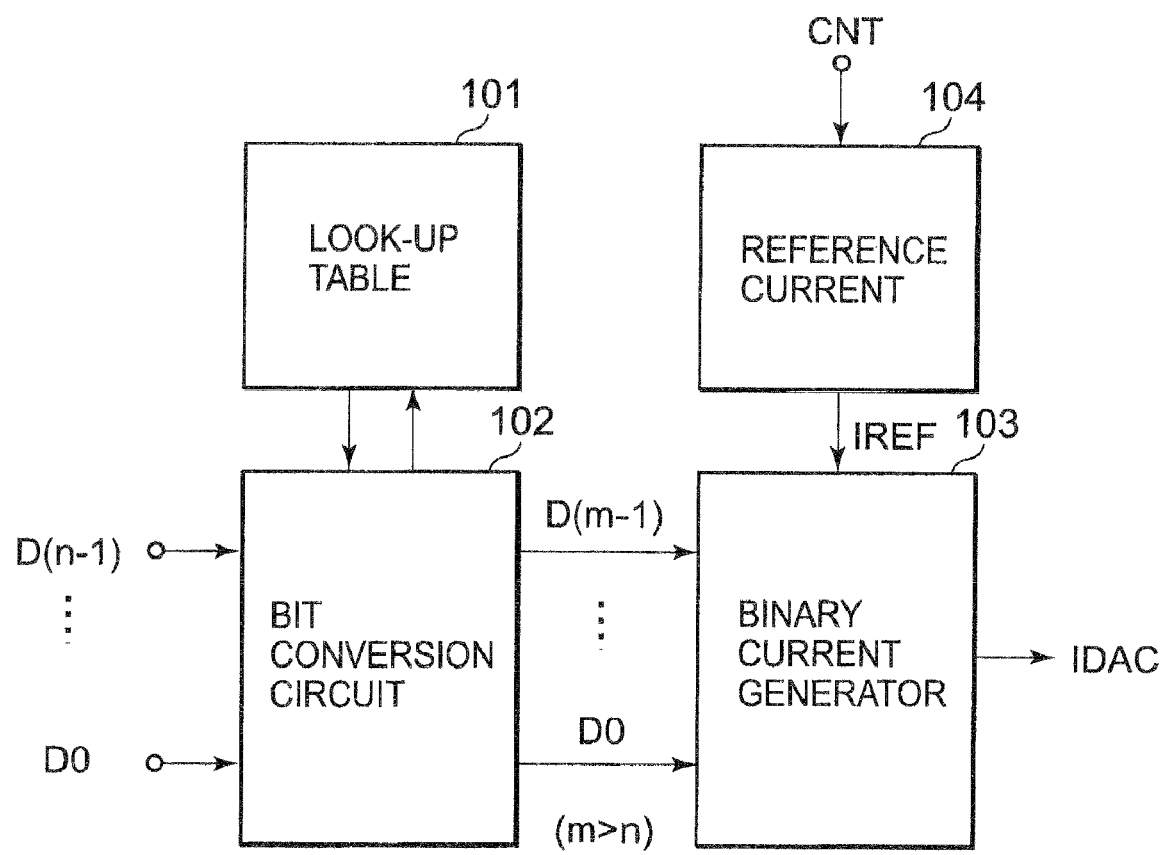
FIG. 16 is a block diagram showing a configuration of a gamma-corrected current output digital-analog conversion circuit according to a related art.
Figure 17:
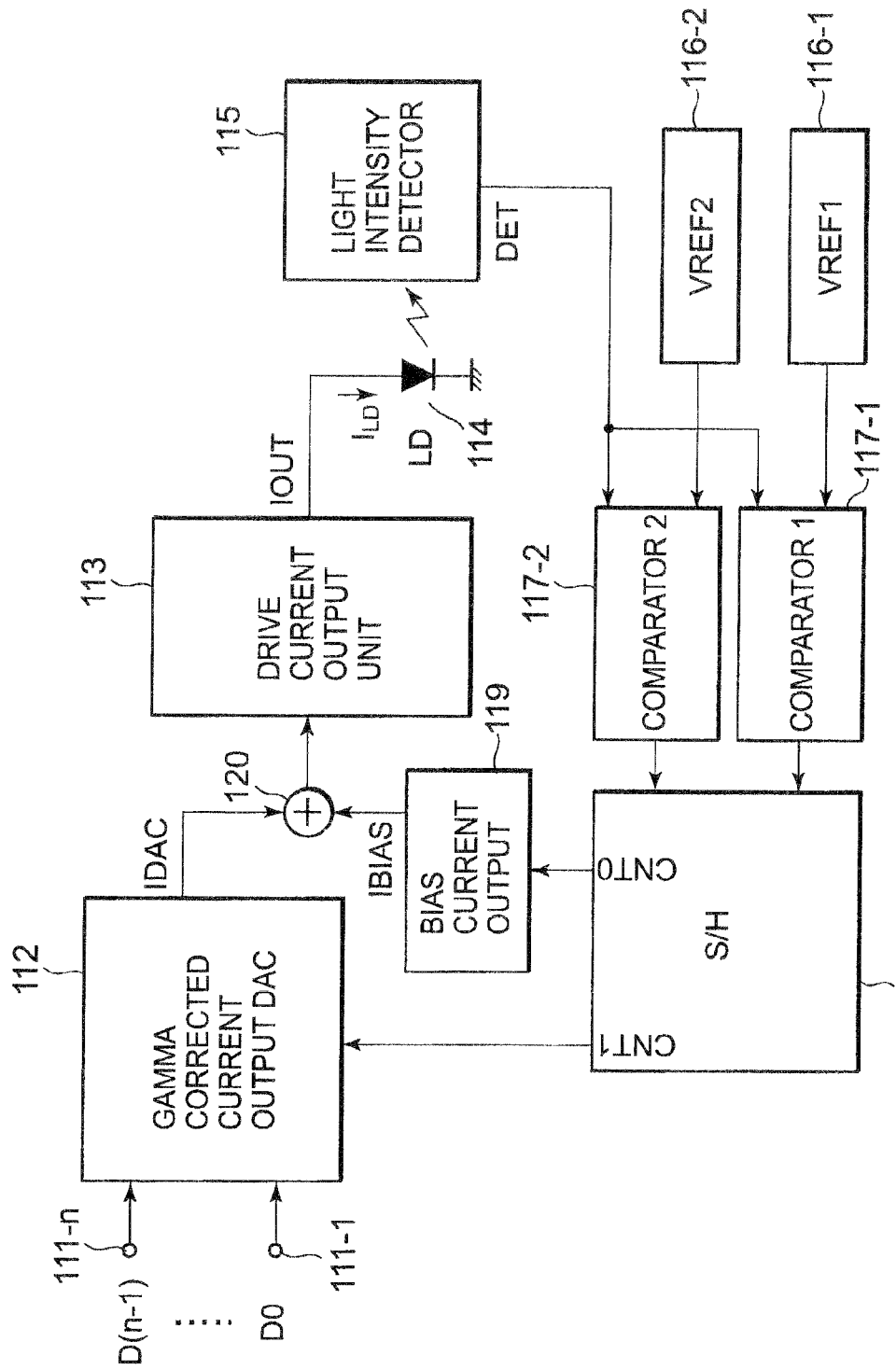
FIG. 17 is a block diagram showing a configuration of a laser diode drive circuit using the gamma-corrected current output digital-analog conversion circuit according to the prior art.
Figure 18:
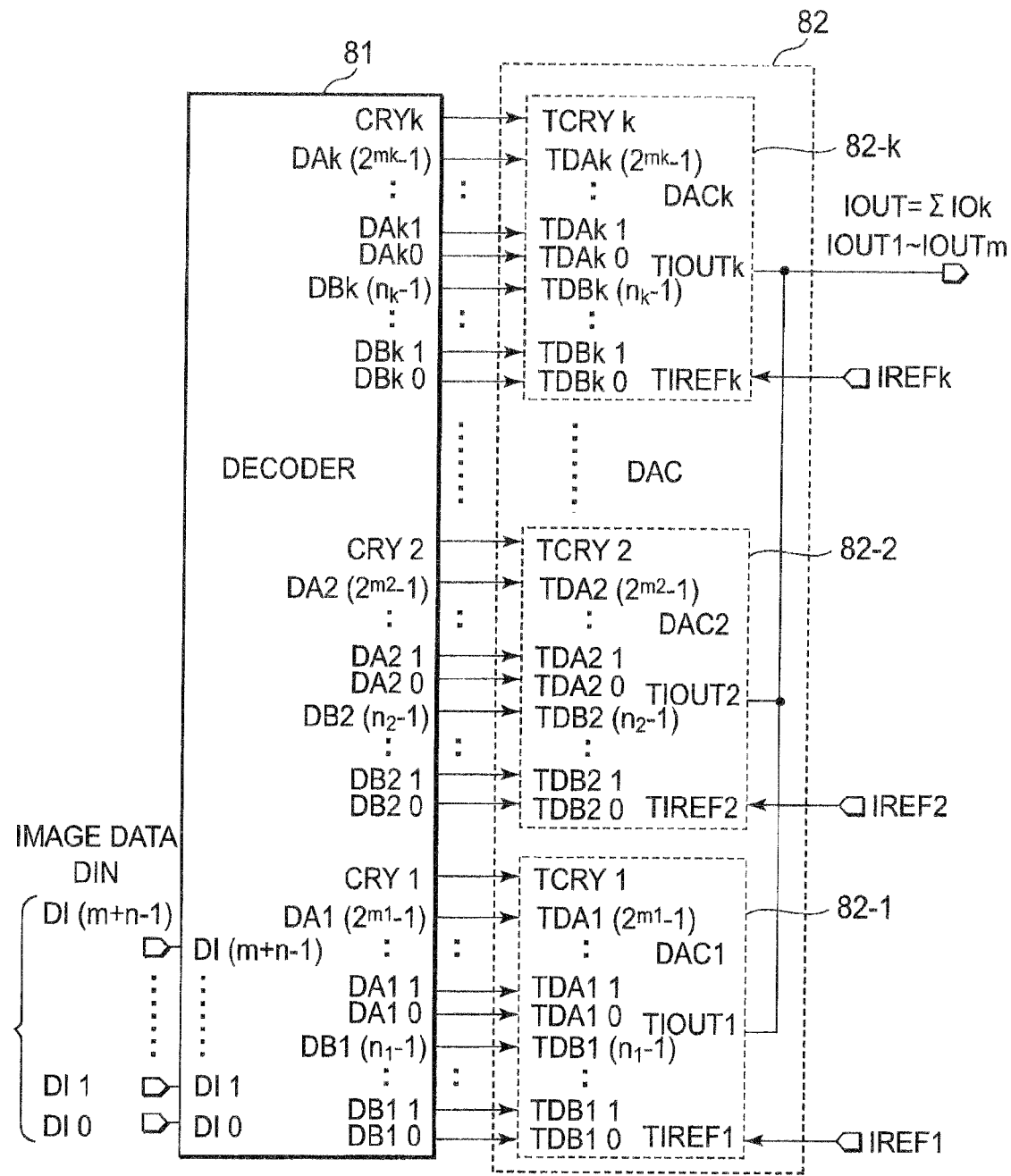
FIG. 18 is a block diagram showing a configuration of a current output type digital-analog conversion circuit shown in Patent Document 1.
Figure 19:
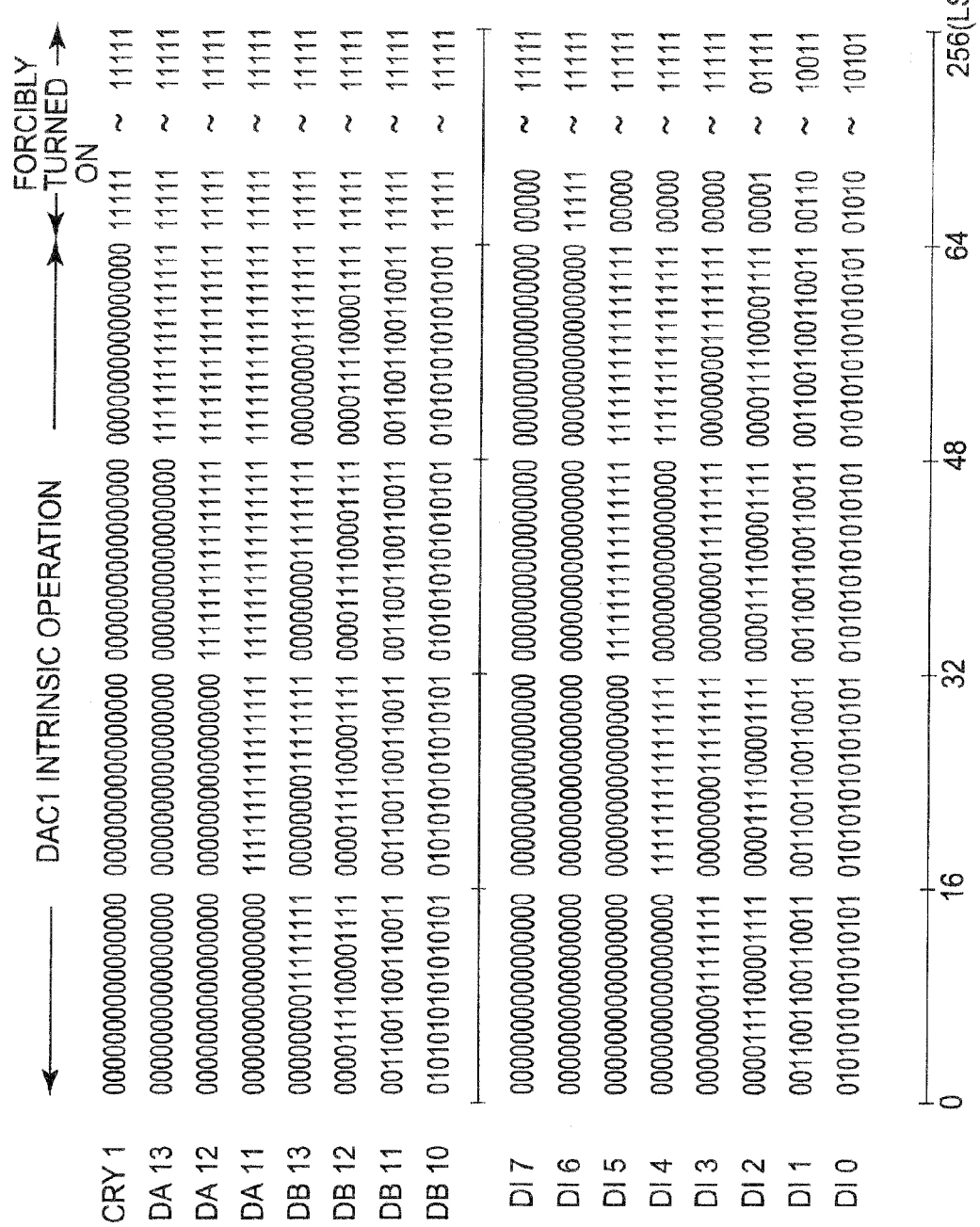
FIG. 19 is a table showing a relationship between input digital data to a decoder forming the current output type digital-analog conversion circuit of Patent Document 1 and decoder output to a DAC1.
Figure 20:
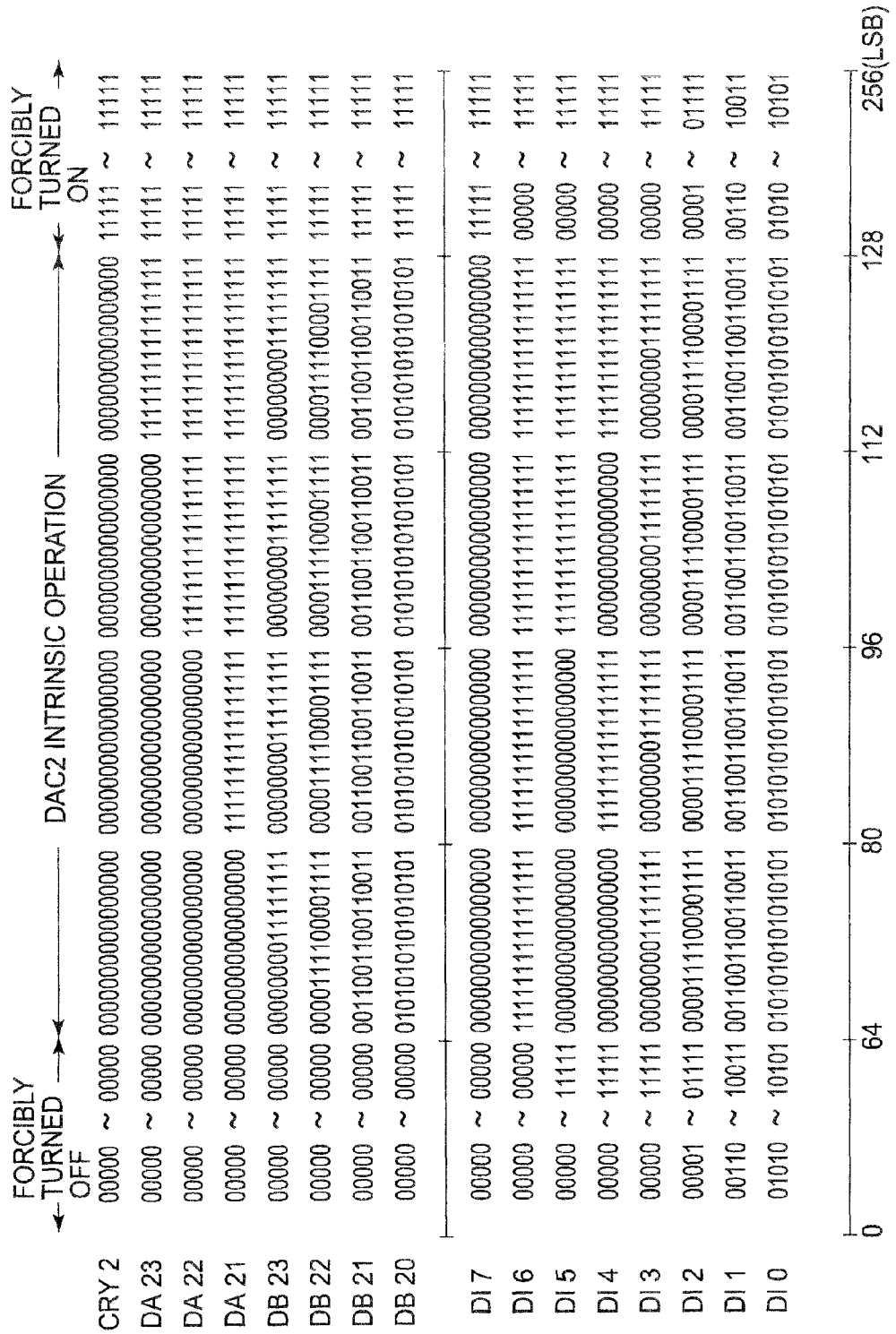
FIG. 20 is a table showing a relationship between input digital data to the decoder forming the current output type digital-analog conversion circuit of Patent Document 1 and decoder output to a DAC2.
Figure 21:
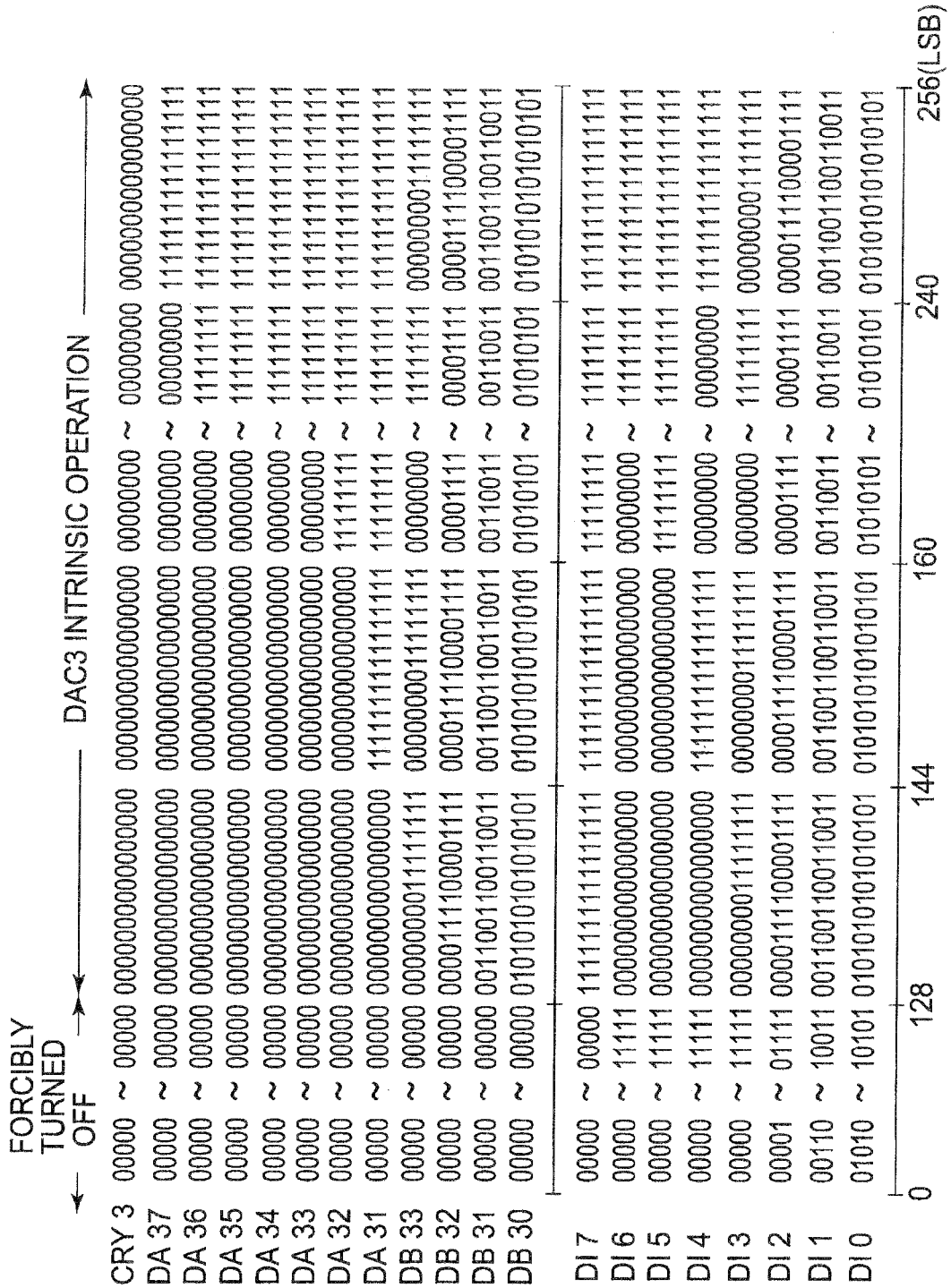
FIG. 21 is a table showing a relationship between input digital data to the decoder forming the current output type digital-analog conversion circuit of Patent Document 1 and decoder output to a DAC3.
Figure 22:
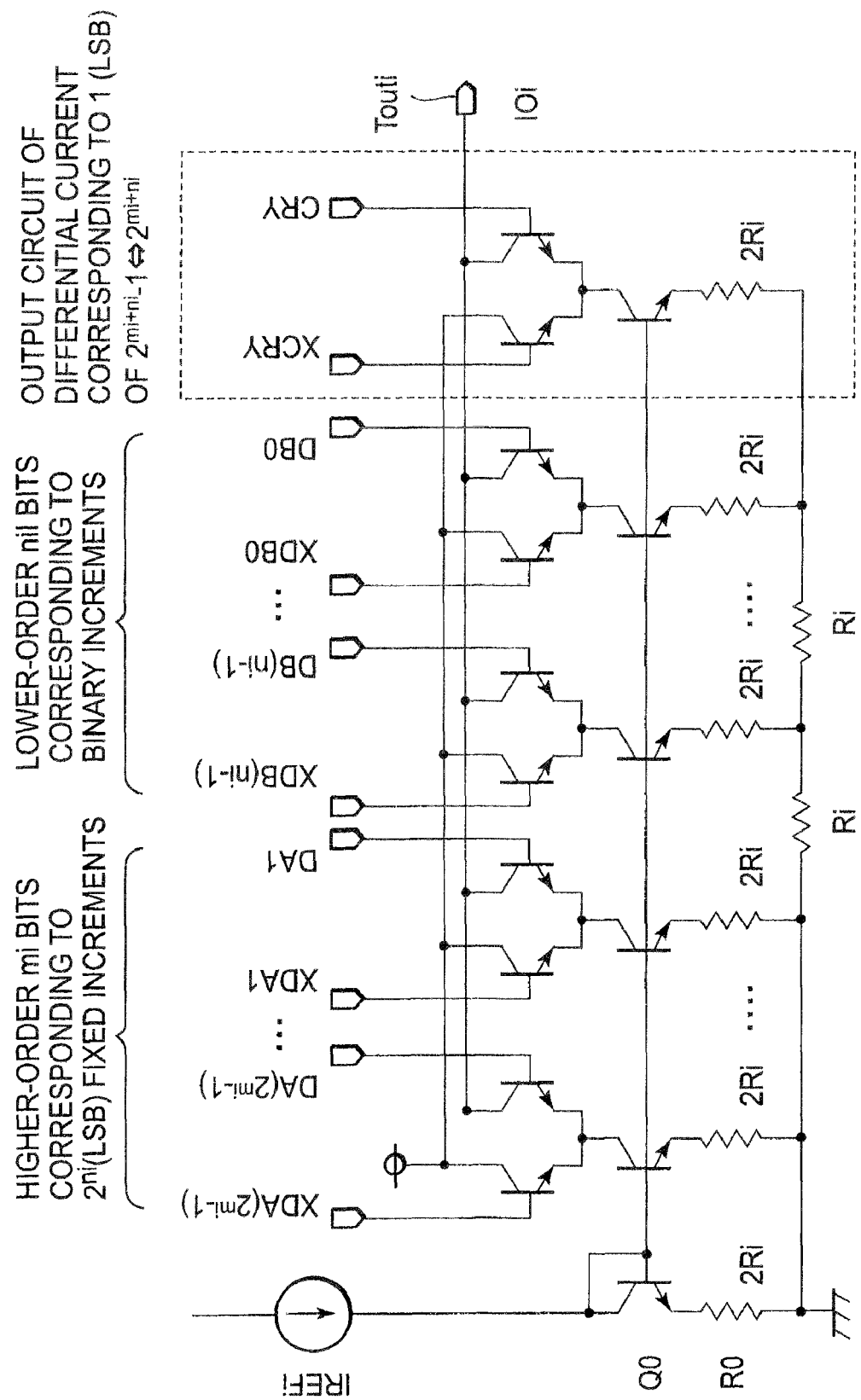
FIG. 22 is a block diagram showing a configuration of a current adding type DAC forming the current output type digital-analog conversion circuit of Patent Document 1.
Figure 23:
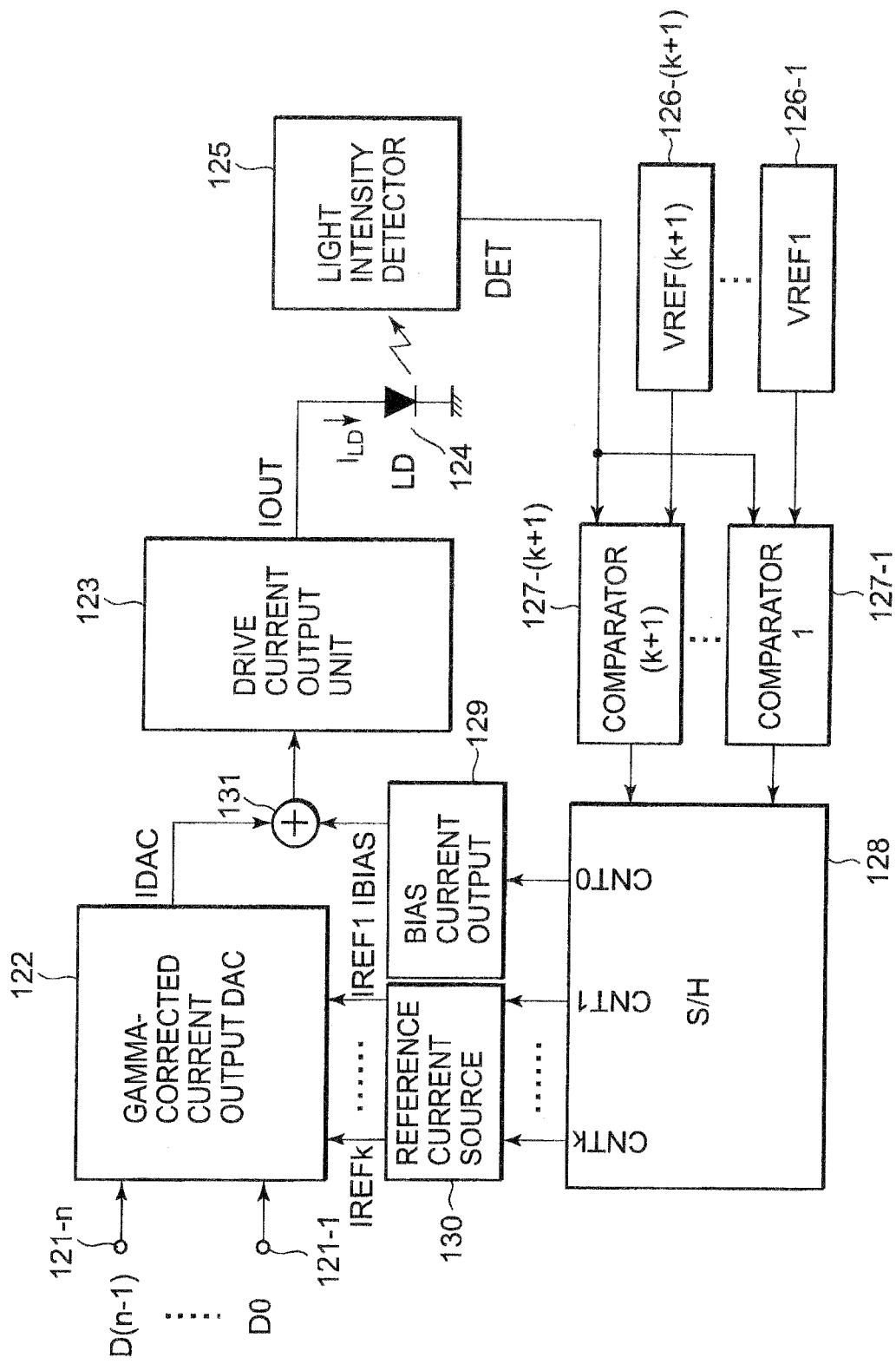
FIG. 23 is a block diagram showing a configuration of a laser diode drive circuit using the current output type digital-analog conversion circuit of Patent Document 1.

A specific example of circuit configuration of the second current output type digital-analog conversion circuit will be described as Example 5, with reference to the drawings. FIG. 15 is a block diagram showing a specific configuration of a current output type digital-analog conversion circuit according to Example 5 when input digital data consists of eight bits of D0 to D7, the lower-order bits of the input digital data consisting of six bits of D0 to D5, and the higher-order bits consisting of two bits of D6 and D7.

The current output type digital-analog conversion circuit is composed of a binary current generator 1 and other binary current generators denoted by 62-1 to 62-4, a bias current output circuit denoted by 63, a binary current source denoted by 65, a carry current source denoted by 66, a bit switch denoted by 67, all-ON switches denoted by 68 and 69, an output enable switch denoted by 70, and a bias current source denoted by 71. Operation of this current output type digital-analog conversion circuit is the same as the operation of the current output type digital-analog conversion circuit according to the fourth example of the invention when n-bits=8 bits, k bits=6 bits, and m=4. Since the operation is the same as the description of the fourth example, the description thereof will be omitted.

The description of the present invention has been made in terms of a case in which the current output type digital-analog conversion circuit is applied to a drive circuit of a current driving type light emitting element. However, it should be understood that the current output type digital-analog conversion circuit may be applied to a drive circuit of a voltage driving type display element by converting the current output of the current output type digital-analog conversion circuit into a voltage. Further, although in the description above, the output current values IO0 to IOm have gamma characteristics proportional to 2.2-th power of decimal values of the video signal levels VIN0 to VINm, it should be understood that any other input/output characteristics may be employed. In the first, second, fourth, and fifth examples of the present invention, the output enable switch is arranged between the carry current source all-ON switch and the output. However, it should be understood that the output enable switch may be arranged between all the bit switches and the carry current source all-ON switch.

The current output type digital-analog conversion circuit of the present invention is composed of a decoder for decoding higher-order bits of input digital data, a plurality of binary current generators, and a current adder. The binary current generators each have means for outputting a binary current which increases linearly as binary values according to the lower-order bits of the input digital data, and means for outputting a predetermined all-ON current. Each of the binary current generators selects either the means for outputting a binary current or the means for outputting an all-ON current of the binary current generator according to decode signals output by the decoder. The current adder adds up and outputs the binary currents and the all-ON currents output by the plurality of binary current generators.

According to the configuration of the present invention, a current output type digital-analog conversion circuit can be obtained which uses a reduced number of control signals and is capable of reducing the circuit scale and the chip area.

Although the present invention has been described in conjunction with a few preferred embodiments thereof, the invention is not limited to the foregoing embodiments but may be modified in various other manners without departing from the spirit and scope of the invention, and it will be understood that all such modifications are intended to be within the scope of the invention.

INDUSTRIAL APPLICABILITY

The current output type digital-analog conversion circuit of the present invention is applicable to graphic display devices such as projectors and LCDs.

This application is based upon and claims the benefit of priority from Japanese Patent Application No. 2006-301191, filed Nov. 7, 2006, the disclosure of which is incorporated herein in its entirety by reference.

The invention claimed is:

1. A current output type digital-analog conversion circuit comprising a decoder and a plurality of binary current generators,
   wherein:
   the decoder outputs a plurality of decode signals obtained by decoding higher-order bits of input digital data while the binary current generators each comprise means for outputting a binary current increasing linearly as binary values according to lower-order bits of the input digital data, and means for outputting a predetermined all-ON current; and
   the current output type digital-analog conversion circuit further comprises:
   means, responsive to the decode signals output from the decoder, for selecting either one of the means for outputting a binary current and the means for outputting an all-ON current of the binary current generators, and means for adding up and outputting the binary currents and the all-ON currents output by the plurality of binary current generators.

2. The current output type digital-analog conversion circuit as claimed in claim 1, wherein:
   the binary current generators each comprise an enable signal input and an all-ON signal input, and comprise means for outputting a binary current when the enable signal input is active, and outputting an all-ON current when the all-ON signal input is active, the all-ON current being equal to the total obtained by adding a predetermined carry current to a current generated when all the lower-order bits of the input digital data take one.

3. The current output type digital-analog conversion circuit as claimed in claim 2, wherein:
   the decode signals output by the decoder are input to the enable signal input and the all-ON signal input of each of the binary current generators;
   the decoder comprises:
   means for outputting a decode signal such that the all-ON signal inputs of the $2^i-1$ binary current generators are made active and the enable signal input of one binary current generator is made active, when the higher-order bits of the input digital signal are $2^i$ or more but less than $2^{i+1}$ in decimal notation.

4. The current output type digital-analog conversion circuit as claimed in claim 3, comprising:
a bias current output circuit for outputting a bias current; and
means for adding up and outputting the bias current, the all-ON currents output by the $2^i-1$ binary current generators, and the binary current output by the one binary current generator.

5. The current output type digital-analog conversion circuit as claimed in claim 4, wherein the binary current generators and the bias current output circuit receive a control signal and the binary current and the carry current output by the binary current generators, and the bias current output by the bias current output circuit are adjustable by the control signal.

6. The current output type digital-analog conversion circuit as claimed in claim 5, wherein:
the decoder outputs $2^{(n-k)}$ decode signals obtained by decoding higher-order (n-k) bits of the input digital data;
the current output type digital-analog conversion circuit comprises $2^{(n-k)}$ binary current generators;
the first decode signal is input to the enable signal input of the first binary current generator;
the i-th$(2 \leq i \leq 2^{(n-k)})$ decode signal is input to the enable signal input of the i-th binary current generator and the all-ON signal input of the (i-1)-th binary current generator; and
the decoder comprises means for sequentially turning ON the decode signals starting from the first decode signal along with the increase of the higher-order (n-k) bits of the input digital data.

7. The current output type digital-analog conversion circuit as claimed in claim 6, wherein the carry current output by the current output type digital-analog conversion circuit assumes a current value corresponding to one LSB of binary current which increases linearly as binary values according to the lower-order bits of the input digital data.

8. The current output type digital-analog conversion circuit as claimed in claim 7, wherein each of the binary current generators comprises:
a carry current source for outputting a carry current;
k binary current sources for outputting k currents which increase from the carry current up to $2^{(k-1)}$ times of the carry current by a rate of a power of 2;
bit switch means for turning ON/OFF the output currents from the k binary current sources according to the lower-order k bits of the input digital data;
all-ON switch means for turning ON/OFF the output current from the carry current source and the output currents from the k binary current sources according to the all-ON signal input; and
output enable switch means for turning ON/OFF the current obtained by adding up the output current from the carry current source and the output currents from the k binary current source according to the enable signal input.

9. The current output type digital-analog conversion circuit as claimed in claim 8, wherein each binary current generator is such that the lower-order k bits of the input digital data are assigned sequentially starting from the lowest-order bit to the highest-order bit, for controlling sequentially starting from the current output bit switch means of the binary current source for outputting a minimum current to the current output bit switch means of the binary current source for outputting a maximum current, respectively.

10. The current output type digital-analog conversion circuit as claimed in claim 7, wherein each of the binary current generators comprises:
a carry current source for outputting a carry current;
k binary current sources for outputting k currents which increase from the carry current up to $2^{(k-1)}$ times of the carry current by a rate of a power of 2;
k decoders for decoding the lower-order k bits of the input digital data and the all-ON signal input and outputting a decode signal;
bit switch means for turning ON/OFF the output currents from the K binary current sources according to the decode signal;
all-ON switch means for turning ON/OFF the output current from the carry current source according to the all-ON signal input; and
output enable switch means for turning ON/OFF the current obtained by adding up the output current from the carry current source and the output currents from the k binary current sources according to the enable signal input.

11. The current output type digital-analog conversion circuit as claimed in claim 10, wherein each binary current generator is such that the lower-order k bits of the input digital data are assigned sequentially starting from the lowest-order bit to the highest-order bit, for controlling sequentially starting from the current output bit switch means of the binary current source for outputting a minimum current to the current output bit switch means of the binary current source for outputting a maximum current, respectively.

12. The current output type digital-analog conversion circuit as claimed in claim 7, wherein each of the binary current generators comprises:
a carry current source for outputting a carry current;
k binary current sources for outputting k currents which increase from the carry current up to $2^{(k-1)}$ times of the carry current by a rate of a power of 2;
k decoders for decoding the lower-order k bits of the input digital data, the all-ON signal input and the enable signal input, and outputting a decode signal;
bit switch means for turning ON/OFF the output currents from the k binary current sources according to the decode signal; and
all-ON switch means for turning ON/OFF the output current from the carry current source according to the all-ON signal input.

13. The current output type digital-analog conversion circuit as claimed in claim 12, wherein each binary current generator is such that the lower-order k bits of the input digital data are assigned sequentially starting from the lowest-order bit to the highest-order bit, for controlling sequentially starting from the current output bit switch means of the binary current source for outputting a minimum current to the current output bit switch means of the binary current source for outputting a maximum current, respectively.

14. The current output type digital-analog conversion circuit as claimed in claim 7, wherein each of the binary current generators comprises:
a carry current source for outputting a carry current;
k binary current sources for outputting k currents which increase from the carry current up to $2^{(k-1)}$ times of the carry current by a rate of a power of 2;
bit switch means for turning ON/OFF the output currents from the k binary current sources according to the lower-order k bits of the input digital data;
all-ON switch means for turning ON/OFF the output current from the carry current source and the output currents from the k binary current sources when the higher-order(n-k) bits of the input digital data take a predetermined bit pattern; and output enable switch means for turning ON/OFF the current obtained by adding up the output current from the carry current source and the output currents from the k binary current sources when the higher-order(n-k) bits of the input digital data take the predetermined bit pattern.

15. The current output type digital-analog conversion circuit as claimed in claim 14, wherein each binary current generator is such that the lower-order k bits of the input digital data are assigned sequentially starting from the lowest-order bit to the highest-order bit, for controlling sequentially starting from the current output bit switch means of the binary current source for outputting a minimum current to the current output bit switch means of the binary current source for outputting a maximum current, respectively.

16. The current output type digital-analog conversion circuit as claimed in claim 2, wherein when the lower-order bits of the input digital data are all one, the output current obtained by incrementing the higher-order bits of the input digital data by one each is proportional to 2.2-th power of a decimal value of the input digital data.

17. he current output type digital-analog conversion circuit as claimed in claim 1, wherein when the lower-order bits of the input digital data are all one, the output current obtained by incrementing the higher-order bits of the input digital data by one each is proportional to 2.2-th power of a decimal value of the input digital data.

18. A light emitting element drive circuit comprising:
a current output type digital-analog conversion circuit as claimed in claim 1;
a light emitting element;
a drive current output unit for outputting a current obtained by amplifying the output current from the current output type digital-analog conversion circuit to modulation-drive the output light intensity of the light emitting element;
an output light intensity detector for detecting the intensity of light output by the light emitting element, and outputting a detection signal;
a reference signal; and
a control unit for comparing the detection signal with the reference signal, and controlling control signals for the plurality of binary current generators and the bias current output circuit of the current output type digital-analog conversion circuit to adjust the output light intensity of the light emitting element,
the bias current output circuit having input/output characteristics composed of a plurality of regions divided with the higher-order bits of the input digital data and having different characteristics, wherein:
the reference signal is composed of a first reference signal corresponding to the minimum light intensity of the light emitting element, and a plurality of second reference signals corresponding to certain light intensities representing the respective regions; and
the control unit has control means for comparing the detection signal corresponding to the minimum input signal with the first reference signal and controlling the control signal for the bias current output circuit to adjust the minimum output light intensity of the light emitting element, and control means for comparing, for all the regions, the detection signal for certain input digital data representing each of the regions with one of the second reference signals and controlling the control signals for the plurality of binary current generators to adjust the variation of output light intensity in all the regions.

19. A graphic display device having the light emitting element drive circuit as claimed in claim 18 mounted therein.

20. A current output type digital-analog conversion circuit comprising a decoder and a plurality of binary current generators, wherein:
the decoder outputs a plurality of decode signals obtained by decoding higher-order bits of input digital data;
each of the binary current generators comprises:
a carry current source for outputting a carry current;
k binary current sources for respectively outputting k currents which increase from the carry current up to a current corresponding to $2^{(k-1)}$ times of the carry current by a rate of a power of 2;
bit switch means for turning ON/OFF the output currents from the k binary current sources;
all-ON switch means for turning ON/OFF the output current from the carry current source; and
output enable switch means for turning ON/OFF the current obtained by adding up the output current from the carry current source and the output currents from the k binary current sources; and
the current output type digital-analog conversion circuit further comprises means for adding up and outputting the binary currents and the all-ON currents output by the plurality of binary current generators.

* * * * *